(12) United States Patent
Shuto et al.

(10) Patent No.: US 9,984,959 B2
(45) Date of Patent: May 29, 2018

(54) SEMICONDUCTOR DEVICE AND MANUFACTURING METHOD THEREOF

(71) Applicant: Renesas Electronics Corporation, Tokyo (JP)

(72) Inventors: Takao Shuto, Takasaki (JP); Kaoru Ishihara, Takasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/162,271

(22) Filed: May 23, 2016

(65) Prior Publication Data
US 2017/0040246 A1    Feb. 9, 2017

(30) Foreign Application Priority Data
Aug. 7, 2015    (JP) ................. 2015-157173

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4825* (2013.01); *H01L 21/565* (2013.01); *H01L 23/3114* (2013.01); *H01L 23/4952* (2013.01); *H01L 23/49513* (2013.01); *H01L 23/49541* (2013.01); *H01L 23/49548* (2013.01); *H01L 23/49582* (2013.01); *H01L 23/5227* (2013.01); *H01L 25/0657* (2013.01); *H01L 25/50* (2013.01); *H01L 21/4842* (2013.01); *H01L 23/3107* (2013.01); *H01L 2224/32145* (2013.01); *H01L 2224/48091* (2013.01);
(Continued)

(58) Field of Classification Search
CPC . H01L 25/043; H01L 25/0657; H01L 25/074; H01L 25/1756; H01L 25/117; H01L 25/0652; H01L 25/071; H01L 25/112
See application file for complete search history.

(56) References Cited

U.S. PATENT DOCUMENTS

| 8,378,470 B2 | 2/2013 | Nakashiba et al. | |
|---|---|---|---|
| 2011/0049693 A1* | 3/2011 | Nakashiba | H01L 23/48 257/676 |
| 2015/0130022 A1* | 5/2015 | Watanabe | H01L 28/10 257/531 |

FOREIGN PATENT DOCUMENTS

JP    2011-054800 A    3/2011

* cited by examiner

*Primary Examiner* — Julio J Maldonado
*Assistant Examiner* — Stanetta Isaac
(74) *Attorney, Agent, or Firm* — McGinn IP Law Group, PLLC.

(57) ABSTRACT

An object of the present invention is to improve the performance of a semiconductor device that transmits signals using inductive coupling of inductors.
A semiconductor device includes a first semiconductor chip having a first inductor formed on the first top surface side and a second semiconductor chip having a second inductor formed on the second top surface side. The first semiconductor chip and the second semiconductor chip are laminated on each other so that the first top surface and the second top surface face each other. Further, a plurality of first pads of the first semiconductor chip is provided along each of a first chip side and a second chip side among four sides of the first top surface. Further, each of the first pads of the first semiconductor chip is not overlapped with the second semiconductor chip in planar view.

18 Claims, 18 Drawing Sheets

(51) Int. Cl.
  *H01L 21/56* (2006.01)
  *H01L 23/31* (2006.01)
  *H01L 23/522* (2006.01)
  *H01L 25/065* (2006.01)
  *H01L 25/00* (2006.01)

(52) U.S. Cl.
  CPC ........ *H01L 2224/48247* (2013.01); *H01L 2224/49171* (2013.01); *H01L 2224/73215* (2013.01); *H01L 2224/73265* (2013.01); *H01L 2225/0651* (2013.01); *H01L 2225/06531* (2013.01); *H01L 2225/06562* (2013.01); *H01L 2225/06582* (2013.01); *H01L 2924/181* (2013.01)

US 9,984,959 B2

SEMICONDUCTOR DEVICE AND MANUFACTURING METHOD THEREOF

CROSS-REFERENCE TO RELATED APPLICATIONS

The disclosure of Japanese Patent Application No. 2015-157173 filed on Aug. 7, 2015 including the specification, drawings and abstract is incorporated herein by reference in its entirety.

BACKGROUND

The present invention relates to, for example, a technique of a semiconductor device that transmits signals between two semiconductor chips arranged so as to face each other using inductive coupling of inductors.

Japanese Unexamined Patent Application Publication No. 2011-54800 describes a semiconductor device that transmits signals between two semiconductor chips arranged so as to face each other using inductive coupling of inductors.

In the case of the semiconductor device that transmits signals between two semiconductor chips arranged so as to face each other using inductive coupling of inductors (induction coils), the inductor is formed on the top surface side of each of the two semiconductor chips, and the two semiconductor chips are laminated on each other so that the top surfaces thereof face each other.

However, bonding pads that are external terminals of the semiconductor chips are formed on the top surface side of each semiconductor chip as similar to the inductors. Therefore, in order not to overlap the bonding pads of one semiconductor chip with the other semiconductor chip, it is necessary to arrange the semiconductor chips while shifting the planar positions thereof from each other.

The inventors of the application studied the semiconductor device having the above-described structure, and found that there are objects in terms of improvement in performance of the semiconductor device from the viewpoint of the reliability of signal transmission and multiple functions of the semiconductor device.

The other objects and novel features will become apparent from the description of the specification and the accompanying drawings.

A semiconductor device according to an embodiment includes a first semiconductor chip having a first inductor formed on the first top surface side and a second semiconductor chip having a second inductor formed on the second top surface side. The first semiconductor chip and the second semiconductor chip are laminated on each other so that the first top surface and the second top surface face each other. Further, a plurality of first pads of the first semiconductor chip is provided along each of a first chip side and a second chip side among four sides of the first top surface. Further, each of the first pads is not overlapped with the second semiconductor chip in planar view.

According to the above-described embodiment, it is possible to improve the performance of a semiconductor device that transmits signals using inductive coupling of inductors.

BRIEF DESCRIPTION OF THE DRAWINGS

FIG. 3 is a perspective plan view for showing an inner structure of the semiconductor device in a state where a sealing body shown in FIG. 1 is seen through;

Figure 1:
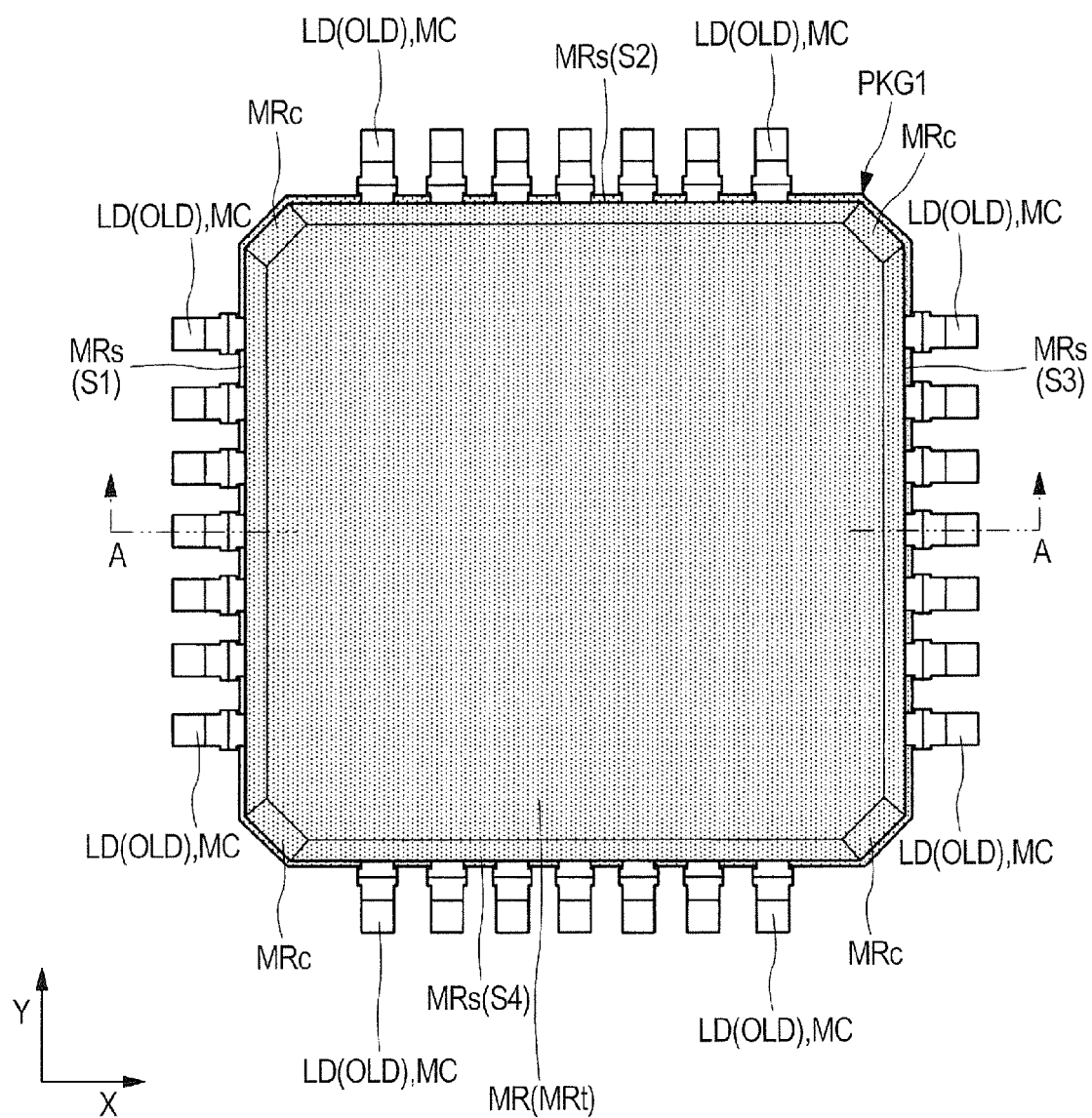
FIG. 1 is a top view of a semiconductor device according to an embodiment.

DETAILED DESCRIPTION (Explanation of Description Form and Basic Terms and Usage in the Application)

An embodiment will be described in the application by being divided into a plurality of sections if necessary for convenience sake. However, the sections are not independent and separated from each other except when specifying not so, but each part of a single example of one section corresponds to a part of details or a part or all of a modified example or the like of the other section irrespective of the former and latter parts of the description. Further, the same parts are not repeatedly explained in principle. Further, the respective constitutional elements in the embodiment are not essential except when specifying not so, except for a case in which the number of constitutional elements is theoretically limited to the specified number, and except for a case in which the respective constitutional elements are obviously essential from the context.

Likewise, in the description of the embodiment or the like, "X made of A" in terms of material, compositions, and the like does not exclude those containing elements other than A except when specifying not so and except for a case in which "X made of A" obviously includes those containing elements other than A. For example, this applies to the meaning of "X composed mainly of A" in the case of components. For example, it is obvious that a "silicon member" or the like is not limited to genuine silicon, but includes a member containing SiGe (silicon-germanium) alloy, multicomponent alloy composed mainly of silicon, or other additives. Further, gold plating, a Cu layer, nickel plating, and the like include not only genuine ones but also members composed mainly of gold, Cu, nickel, and the like except when specifying not so.

Further, when a specific value or quantity is mentioned, the value may be smaller or larger than the specific value except when specifying not so, except for a case in which the value is theoretically limited to the specific value, and except for a case in which the value is not obviously smaller or larger than the specific value from the context.

Further, terms of "planar surface" and "side surface" are used in the application. The surface parallel to a reference surface that is a surface of a semiconductor chip on which semiconductor elements are formed is described as the planar surface. Further, the surface intersecting with the planar surface is described as the side surface. Further, a direction of connecting separately-arranged two planar surfaces in side view is described as a thickness direction.

Further, terms of "upper surface" and "lower surface" are used in some cases in the application. For example, the upper surface is arranged below the lower surface after a semiconductor package is mounted in some cases because there are various mounting modes of the semiconductor package. In the application, the planar surface of a semiconductor chip on which elements are formed or the planar surface of a wiring substrate on which a chip is mounted is described as the upper surface, and the surface located opposite to the upper surface is described as the lower surface.

Further, the same or similar parts are represented by the same or similar signs or reference numerals in each drawing of the embodiment, and the explanations thereof are not repeated in principle.

Further, in the accompanying drawings, hatchings or the like are omitted in some cases even in a cross-sectional view when being complicated by the hatchings or when a void is clearly distinguished. In connection with this, even in the case of a closed hole in planar view, the outlines of the background are omitted in some cases when being apparent from explanation or the like. Further, hatchings or dot patterns are illustrated in some cases in order to clearly specify not a void or to clearly specify a boundary between regions even in a drawing other than a cross-sectional view.

<Semiconductor Device>

Figure 2:
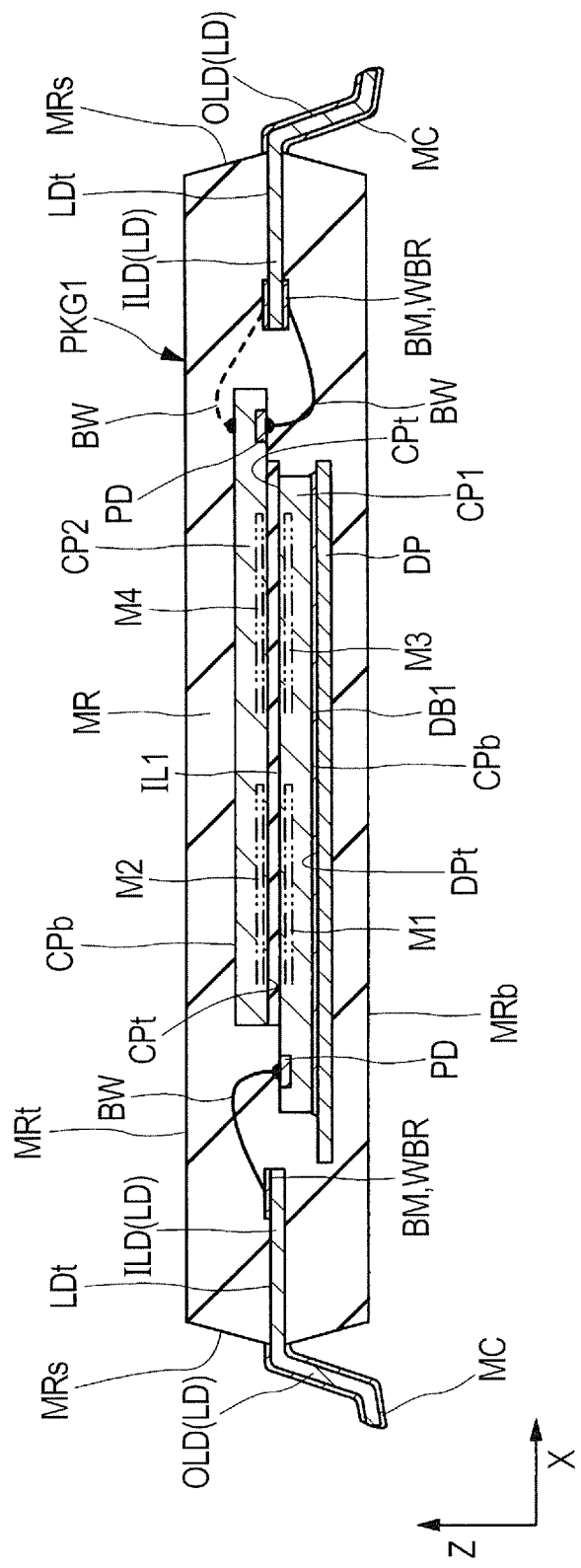
FIG. 2 is a cross-sectional view along the A-A line of FIG. 1.
Figure 3:
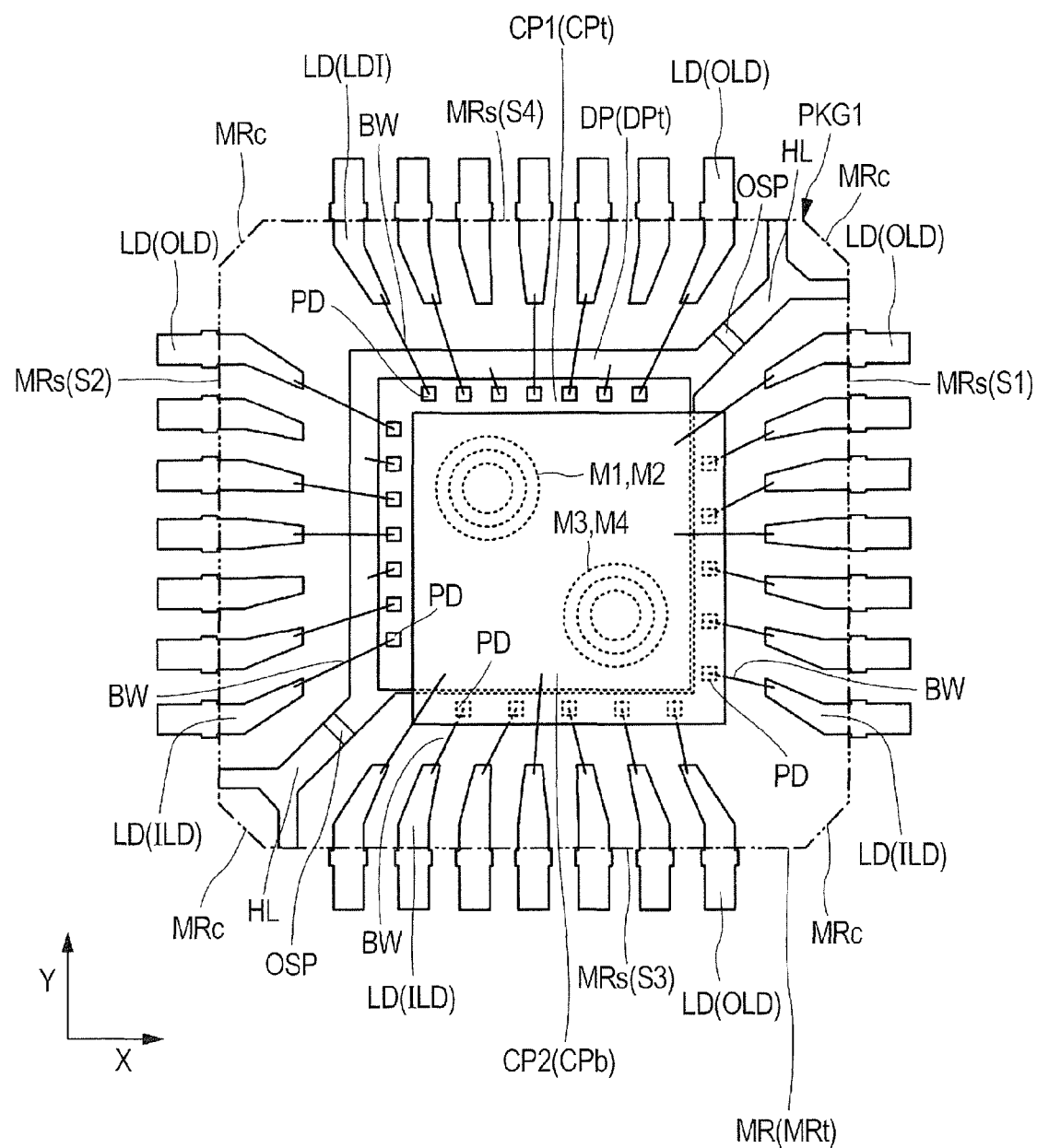
Figure 4:
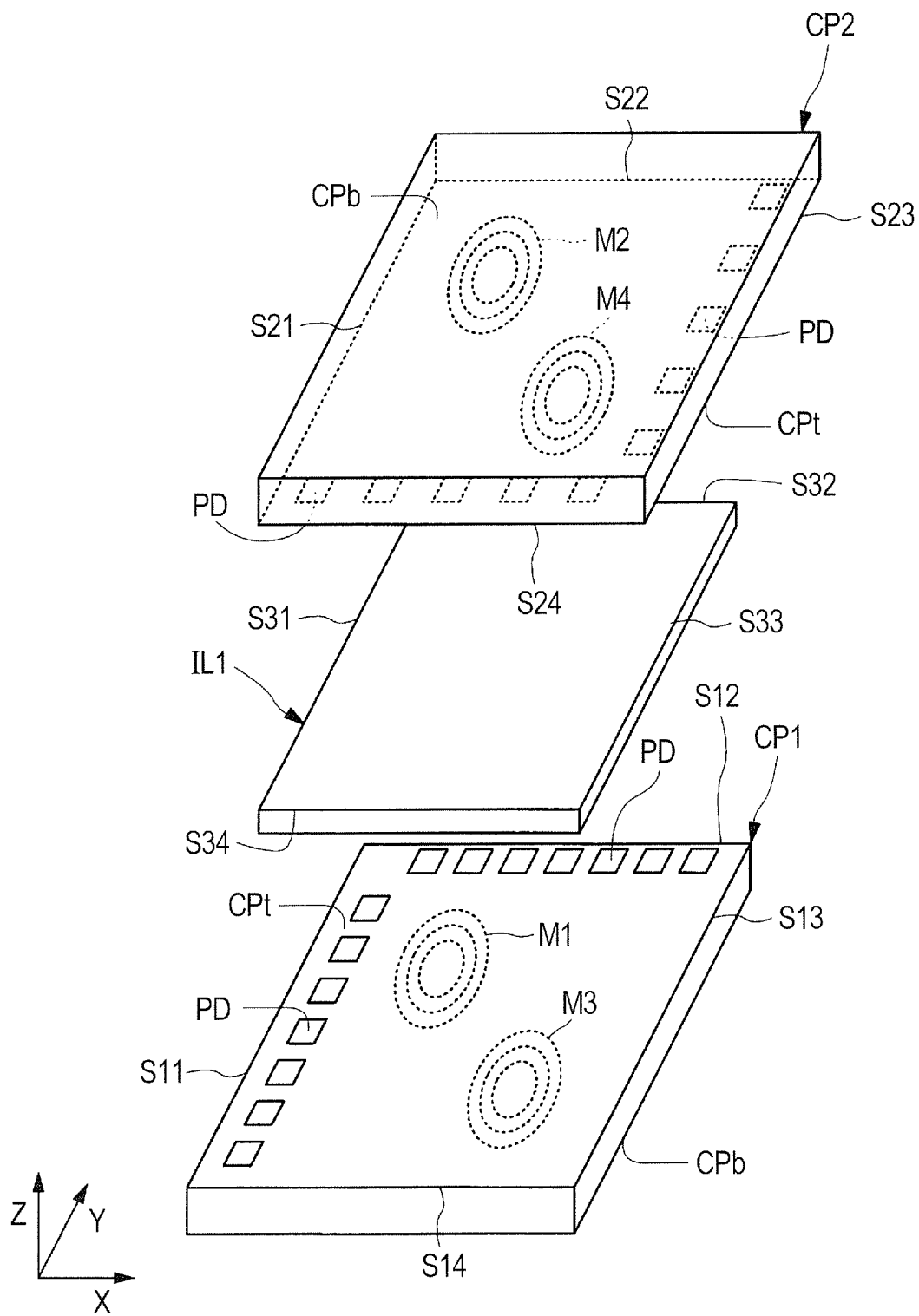
FIG. 4 is an exploded view for showing a lamination structure of a semiconductor chip shown in FIG. 3.

First, an outline of a configuration of a semiconductor device PKG1 according to an embodiment will be described. FIG. 1 is a top view of a semiconductor device according to the embodiment. Further, FIG. 2 is a cross-sectional view along the line A-A of FIG. 1. Further, FIG. 3 is a perspective plan view for showing an inner structure of the semiconductor device in a state where a sealing body shown in FIG. 1 is seen through. Further, FIG. 4 is an exploded view for showing a lamination structure of a semiconductor chip shown in FIG. 3.

Inductors M1, M2, M3, and M4 are represented by giving two-dot chain lines in FIG. 2 in order to schematically show the positions thereof. Further, a wire BW coupled to a back surface CPb of a semiconductor chip CP2 is represented by a dotted line in FIG. 2 in order to show that some wires BW are coupled to the back surface CPb of the semiconductor chip CP2. Further, FIG. 3 is a perspective plan view viewed from the upper surface MRt side of a sealing body MR shown in FIG. 1, and a plurality of pads PD and the inductors M1, M2, M3, and M4 of the semiconductor chip CP2 cannot be seen. Likewise, the pads PD and the inductors M1, M2, M3, and M4 of the semiconductor chip CP2 cannot be also seen in FIG. 4. However, the pads PD, the inductors M1, M2, M3, and M4, and a part of a die pad DP of the semiconductor chip CP2 are represented by giving dotted lines in each of FIG. 3 and FIG. 4 in order to define a planar positional relation between respective constitutional parts of the semiconductor chips CP1 and CP2. Further, each of the inductors M1, M2, M3, and M4 is, for example, a coil, and each of the inductors M1, M2, M3, and M4 is schematically shown as three concentric circles in each of FIG. 3 and FIG. 4. Further, an insulating film IL1 shown in each of FIG. 2 and FIG. 4 is not illustrated in FIG. 3 for easily viewing the drawing.

As shown in each of FIG. 1 to FIG. 3, a semiconductor device (inductive coupling device) PKG1 has a plurality of semiconductor chips CP1 and CP2 (see FIG. 2 and FIG. 3) mounted on a die pad (chip mounting part) DP (see FIG. 2 and FIG. 3) and a plurality of leads LD arranged around the semiconductor chips CP1 and CP2. Further, the semiconductor device PKG1 has a plurality of wires BW (see FIG. 2 and FIG. 3) that are conductive members to electrically couple the semiconductor chips CP1 and CP2 to the leads LD. Further, the semiconductor chips CP1 and CP2 and the wires BW are sealed with a sealing body (resin body) MR. Further, an inner lead part ILD (see FIG. 2 and FIG. 3) of each of the leads LD is sealed with the sealing body MR, and an outer lead part OLD of each of the leads LD is exposed from the sealing body MR.

As shown in FIG. 1, the semiconductor device PKG1 of the embodiment has an appearance shape in which the leads LD protrude from some parts of a plurality of side surfaces MRs of the sealing body (sealing part) MR formed in a quadrangular shape in planar view. The sealing body MR has an upper surface MRt, a lower surface MRb (see FIG. 2) located opposite to the upper surface MRt, and four side surfaces MRs located between the upper surface MRt and the lower surface MRb.

Each corner part MRc of the sealing body MR includes a region around the corner that is an intersection point of arbitrary two sides (two main sides) that intersect with each other among four sides (four main sides). Strictly, it should be noted that each corner part MRc of the sealing body MR is chamfered as shown in FIG. 1 and FIG. 3 (FIG. 1 shows an example of taper machining, but may be R machining), and thus the intersection point of the main sides is arranged on the outer side relative to each corner part MRc of the sealing body MR. However, the chamfered part is sufficiently small as compared to the length of the main side, and thus the center of the chamfered part is regarded as a corner of the sealing body MR in the description of the application.

Further, in the case of the semiconductor device PKG1 in which the leads LD are provided at the respective four sides of the sealing body MR that is quadrangular in a planar shape as in the embodiment, the range of each corner part MRc can be defined as follows. Specifically, the leads LD are aligned along each of a side S1, a side S2, a side S3, and a side S4 in the semiconductor device PKG1 as shown in FIG. 1. The corner part MRc is defined as a region between the leads LD provided on the outermost side in the arrangement of the leads LD along the respective sides among the leads LD. When the corner part MRc of the sealing body MR is explained in the application, the meaning and content are the same as the above description except when specifying that the meaning and content are different.

Further, as shown in FIG. 1 and FIG. 3, the leads LD are arranged along each side (each main side) of the sealing body MR that is quadrangular in a planar shape in the semiconductor device PKG1. The leads LD are made of metal material, and are metal members composed mainly of, for example, copper (Cu) in the embodiment. In the example shown in FIG. 1, the sealing body MR is square in a planar shape, and the leads LD protrude towards the outer side of the sealing body MR from each of the four sides of the sealing body MR. Such a semiconductor package is referred to as QFP (Quad Flat Package).

However, the technique to be described below can be applied to semiconductor packages of various modified examples. For example, the technique can be applied to a semiconductor package referred to as SOP (Small Outline Package) in which the sealing body MR is rectangular in a planar shape. In the case of SOP, the leads LD protrude towards the outer side from each of the long sides facing each other among the four sides of the sealing body MR. On the other hand, the leads LD do not protrude from each of the short sides facing each other among the four sides of the sealing body MR.

The outer lead parts OLD of the leads LD protrude towards the outer sides of the sealing body MR in the side surfaces MRs of the sealing body MR. Further, on the exposed surface of the outer lead part OLD of each lead LD, a metal film (exterior plating film) MC is formed on, for example, the surface of a base material composed mainly of copper. The metal film MC is made of metal material such as solder that is superior in wettability against solder to copper that is a base material, and is a metal coating film coating the surface of a copper member that is a base material. The metal film MC made of solder or the like is formed at the outer lead part OLD of each lead LD that is an external terminal of the semiconductor device PKG1. Thus, the solder wettability can be improved when the semiconductor device PKG1 is mounted on a mounting substrate (not shown). Accordingly, the joining strength between the leads LD and terminals on the mounting substrate side can be improved.

It should be noted that FIG. 2 shows an example in which the metal film MC that is a solder film is formed on the exposed surface of the outer lead part OLD of each lead LD by a plating method. However, there are various modified examples for the metal film MC. For example, the metal film MC may be a lamination film of a metal film composed mainly of nickel (Ni) and a metal film composed mainly of palladium (Pd). Alternatively, for example, a metal film composed mainly of gold (Au) may be further laminated on the surface of the metal film composed mainly of palladium. Further, in the case where the metal film MC is configured using material other than solder, the metal film MC may be formed so as to cover the surfaces of the inner lead parts ILD and the outer lead parts OLD of the leads LD.

Further, as shown in FIG. 2 and FIG. 3, the semiconductor chips CP1 and CP2 are sealed inside the sealing body MR. FIG. 2 shows an example of a structure in which the semiconductor chip (an output part or a semiconductor chip for output) CP1 on the transmission side and the semiconductor chip (an input part or a semiconductor chip for input) CP2 on the reception side that are mounted on the die pad DP are arranged so as to face each other through the insulating film IL1. Further, the semiconductor chip CP2 is mounted on the top surface CPt of the semiconductor chip CP1 so that the top surface CPt of the semiconductor chip CP1 and the top surface CPt of the semiconductor chip CP2 face each other.

As shown in FIG. 4, each of the semiconductor chips CP1 and CP2 has a quadrangular (quadrilateral) top surface (an upper surface or a face) CPt, a quadrangular (quadrilateral) back surface (a lower surface or a face) CPb opposite to the top surface CPt, and the pads PD arranged on the top surface CPt. Further, the semiconductor chip CP1 and the semiconductor chip CP2 of the embodiment configure a pair of coupling devices that transmits signals between the semiconductor chips using inductive coupling of inductors. Therefore, each of the semiconductor chips CP1 and CP2 includes an inductor used for signal transmission. In the example shown in FIG. 4, the semiconductor chip CP1 includes an inductor M1 and an inductor M3 that are provided on the top surface CPt side and are electrically coupled to the pads PD. Further, the semiconductor chip CP2 includes an inductor M2 and an inductor M4 that are provided on the top surface CPt side and are electrically coupled to the pads PD.

Specifically, each of the semiconductor chip CP1 and the semiconductor chip CP2 includes a semiconductor substrate made of, for example, silicon (Si). In addition, circuit elements such as the inductors M1, M2, M3, and M4 are formed on one face (the face on the top surface CPt side) of each semiconductor substrate. Each of the inductors M1, M2, M3, and M4 is, for example, a coil. In addition, the pads PD are electrically coupled to the circuit elements such as the inductors through wirings (not shown) formed in a wiring layer arranged inside (specifically, between the top surface CPt and the semiconductor substrate (not shown)) of the semiconductor chips CP1 and CP2.

In the example shown in each of FIG. 2 to FIG. 4, the semiconductor chip CP1 on the transmission side is provided on the lower surface MRb side of the sealing body MR, and the semiconductor chip CP2 on the reception side is provided on the upper surface MRt side of the sealing body MR. However, either the semiconductor chip CP1 on the transmission side or the semiconductor chip CP2 on the reception side may be arranged on the upper side. As a modified example of FIG. 2, the semiconductor chip CP1 on the transmission side may be provided on the upper surface MRt side of the sealing body MR, and the semiconductor chip CP2 on the reception side may be provided on the lower surface MRb side of the sealing body MR.

Further, each of the semiconductor chip CP1 and the semiconductor chip CP2 has the inductors. Specifically, the semiconductor chip CP1 on the transmission side includes the inductor M3 for reception in addition to the inductor M1 for transmission. Further, the semiconductor chip CP2 on the reception side includes the inductor M4 for transmission in addition to the inductor M2 for reception. As a modified example of the embodiment, at least, the inductor M1 and the inductor M3 may be provided in order to transmit a signal from the semiconductor chip CP1 on the transmission side to the semiconductor chip CP2 on the reception side. However, from the viewpoint of improving the reliability of signal transmission, it is preferable that after the semiconductor chip CP2 on the reception side receives a signal, a reply signal is transmitted to the semiconductor chip CP1 to verify that the signal has been correctly transmitted. Therefore, each of the semiconductor chip CP1 and the semiconductor chip CP2 has the inductors as shown in FIG. 2 to FIG. 4 in the embodiment.

Further, insulating films covering the substrates and the wirings of the semiconductor chips CP1 and CP2 are formed on the top surfaces CPt of the semiconductor chips CP1 and CP2, and the surface of each of the pads PD is exposed from the insulating film in an opening formed in the insulating film. Further, the pads PD are made of metal, and are made of, for example, aluminum (Al) in the embodiment. The details of layouts in the top surfaces CPt of the pads PD of the semiconductor chip CP1 and the semiconductor chip CP2 will be described later.

Further, as shown in FIG. 3, the leads LD are arranged around the lamination body of the semiconductor chip CP1, the insulating film IL1 (see FIG. 2), and the semiconductor chip CP2 (in other words, around the die pad DP). In addition, the pads (bonding pads) PD arranged on the top surface CPt of each of the semiconductor chips CP1 and CP2 are electrically coupled to the inner lead parts ILD of the leads LD through the wires (conductive members) BW. The wires BW are made of, for example, gold (Au) or copper (Cu), and one part (for example, one end part) of each wire BW is joined to the pad PD, the other part (for example, the other end part) is joined to a bonding part WBR (see FIG. 2) of the inner lead part ILD. It should be noted that a metal film (a plating film or a plating metal film) BM (see FIG. 2) is formed on the surface of the bonding part WBR of the inner lead part ILD. The metal film BM is made of material (for example, a lamination structure in which a thin gold film is formed on a palladium film) composed mainly of, for example, silver (Ag), gold, or palladium. The metal film BM made of material composed mainly of silver, gold, or palladium is formed on the surface of the bonding part WBR of the inner lead part ILD, so that the joining strength with the wires BW made of gold can be improved.

Further, in the example shown in FIG. 3, some pads PD are electrically coupled to the die pad DP through the wires BW. The die pad DP is electrically coupled to back surface electrodes provided on the back surface CPb of the semiconductor chip CP1, and some pads PD of the semiconductor chip CP1 are electrically coupled to the back surface electrodes of the semiconductor chip CP1 through the wires BW and the die pad DP. Further, other parts of the leads LD are electrically coupled to back surface electrodes formed on the back surface CPb of the semiconductor chip CP2 through the wires BW. Specifically, a metal film made of, for example, gold is formed on the back surface CPb of the semiconductor chip CP2, and the metal film functions as the back surface electrodes. In addition, one parts (for example, one end parts) of the wires BW are joined to the back surface electrodes formed on the back surface CPb of the semiconductor chip CP2, and the other parts (for example, the other end parts) are joined to the bonding parts WBR (see FIG. 2) of the inner lead parts ILD. Accordingly, the back surface electrodes of the semiconductor chip CP2 are electrically coupled to the leads LD through the wires BW.

As described above, if the back surface electrodes and leads LD of the semiconductor chips CP1 and CP2 are electrically coupled to each other, the back surface electrodes of the semiconductor chips CP1 and CP2 can be used as terminals. For example, in the case where the back surface electrodes are used as terminals for supplying reference potential and power supply potential to the semiconductor chips CP1 and CP2, the cross-sectional area of a potential supplying route is increased, and thus the potential can be stabilized.

It should be noted that the die pad DP and the leads LD are electrically coupled to each other through the semiconductor chip CP1 in the example shown in FIG. 3. However, as a modified example, some leads LD and the die pad DP may be electrically coupled to each other through the wires BW.

Further, the semiconductor chip CP1 is mounted on the die pad DP that is a chip mounting part. In the example shown in FIG. 3, an upper surface (chip mounting face) DPt of the die pad DP is larger in the planar area than the top surface CPt of the semiconductor chip CP1.

Further, hanging leads HL are arranged around the die pad DP as shown in FIG. 3. The hanging leads HL are members for supporting the die pad DP at a support part (frame part) of a lead frame in a manufacturing process of the semiconductor device PKG1. In the example shown in FIG. 3, two hanging leads HL are arranged towards the corner parts MRc of the sealing body MR. Specifically, the hanging leads HL are not coupled to two corner parts of the die pad DP facing each other. On the other hand, one end parts of the two hanging leads HL are coupled to parts other than the corner parts of the die pad DP. Further, the other end parts of the two hanging leads HL extend towards the corner parts MRc of the sealing body MR, and each of them is divided into two near the corner part MRc to be exposed from the sealing body MR in the side surface MRs of the sealing body MR. The effect obtained by the configuration in which the hanging leads HL are not coupled to the two corner parts of the die pad DP will be described later.

Further, the upper surface DPt of the die pad DP is different in height from the upper surface of the inner lead part ILD of each lead LD. In the example shown FIG. 2, the upper surface DPt of the die pad DP is arranged at a position lower than the upper surface LDt of each inner lead part ILD. Therefore, an offset part (down-set part in the example of the embodiment) OSP bent so that the height of the upper surface DPt of the die pad DP is positioned differently from that of the upper surface LDt (see FIG. 2) of the inner lead part ILD of each lead LD is provided at each of the hanging leads HL shown in FIG. 3.

Further, as shown in FIG. 2, the semiconductor chip CP1 is mounted on the die pad DP through a die bond material (an adhesive or a conductive adhesive) DB1 in a state where the back surface CPb is allowed to face the upper surface DPt of the die pad DP. Namely, the semiconductor chip CP1 is mounted on the die pad DP by a so-called face-up mounting method in which the surface (back surface CPb) opposite to the top surface (main surface) CPt on which the pads PD are formed is allowed to face the chip mounting face (upper surface DPt). The die bond material DB1 is an adhesive used for die bonding of the semiconductor chip CP1, and, for example, a resin adhesive obtained by containing metal particles made of silver or the like in epoxy thermosetting resin or a metal joint material such as a solder material is used. It should be noted that a non-conductive adhesive can be used as the die bond material DB1 in the case where it is not necessary to electrically couple the back surface CPb of the semiconductor chip CP1 to the die pad DP.

<Detail of Signal Transmission Part>

Figure 5:
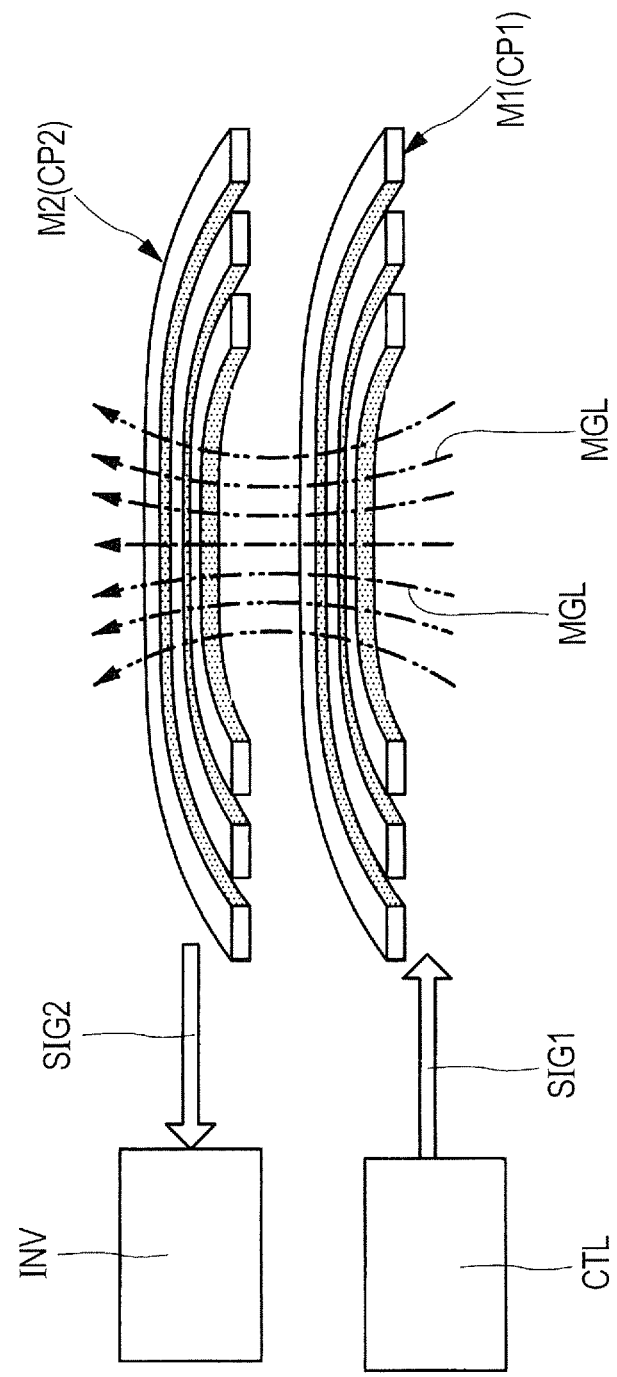
FIG. 5 is an explanatory view for schematically showing a state in which signals are transmitted between inductors for transmission and reception shown in FIG. 4.
Figure 6:
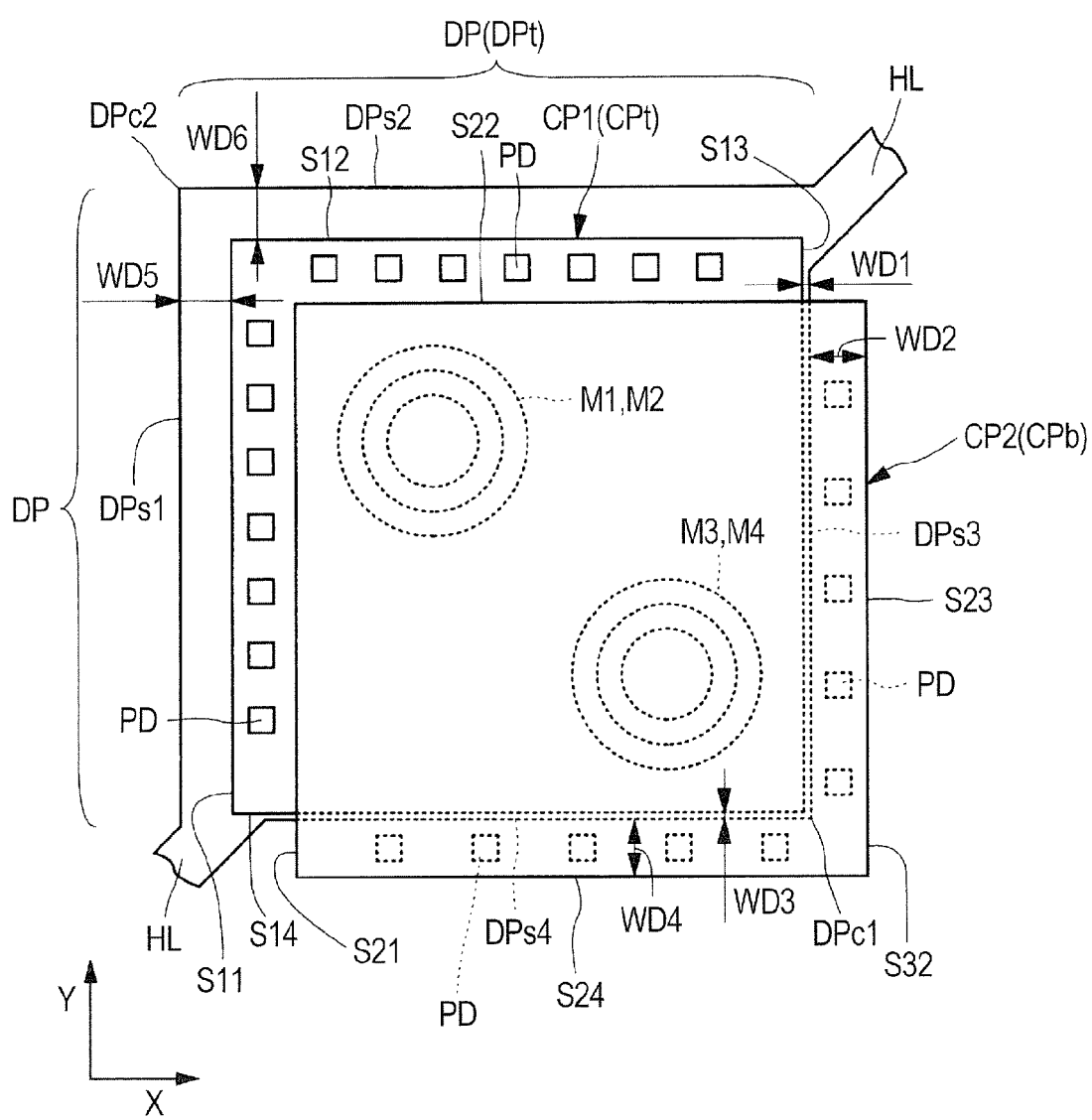
FIG. 6 is an enlarged plan view for showing a planar positional relation between two semiconductor chips shown in FIG. 3.
Figure 19:
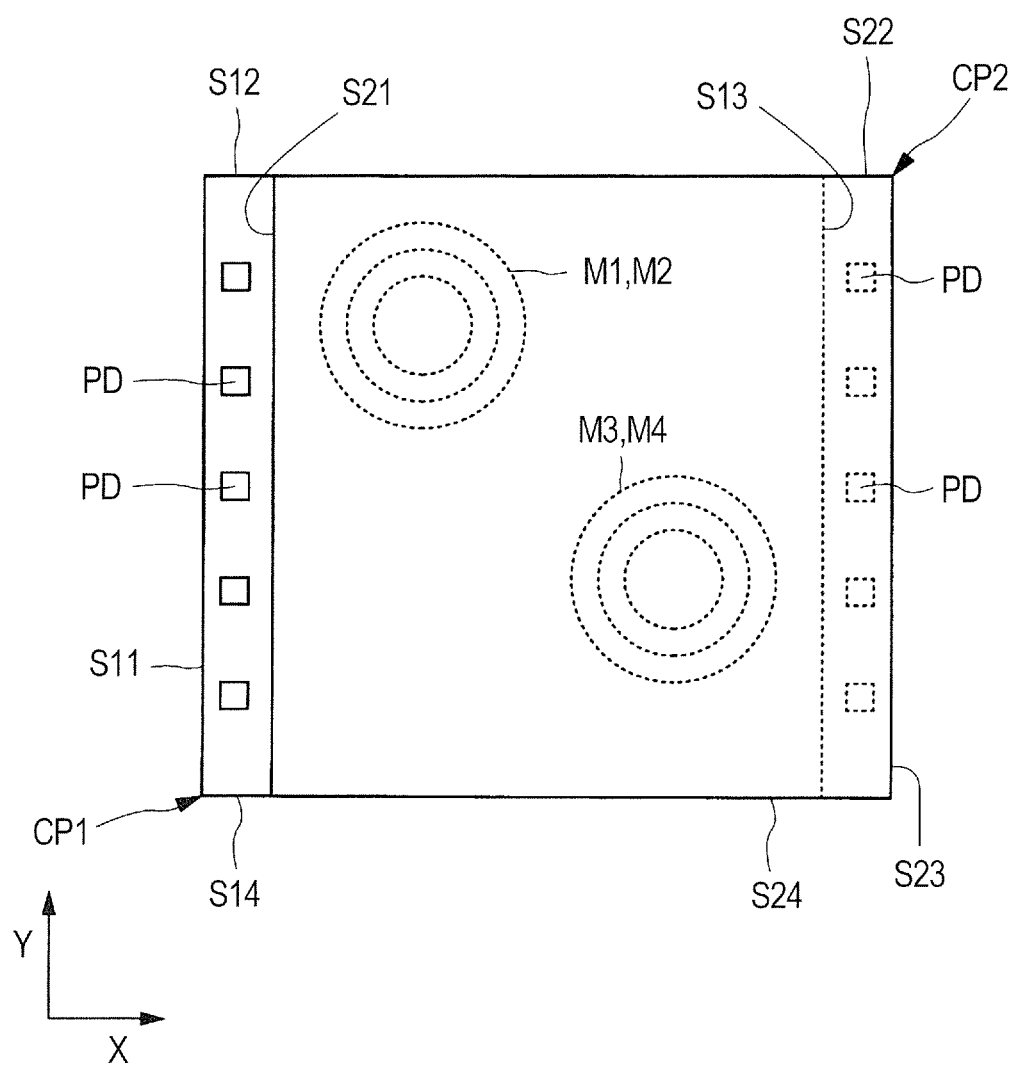
FIG. 19 is an enlarged plan view for showing a study example of FIG. 6.

Next, details of the lamination structure of the semiconductor chips CP1 and CP2 shown in FIG. 2 to FIG. 4 will be described. FIG. 5 is an explanatory view for schematically showing a state in which signals are transmitted between the inductors for transmission and reception shown in FIG. 4. Further, FIG. 6 is an enlarged plan view for showing a planar positional relation between the two semiconductor chips shown in FIG. 3. Further, FIG. 19 is an enlarged plan view for showing a study example of FIG. 6.

It should be noted that FIG. 5 schematically shows a state in which signals are transmitted using inductive coupling between the inductor M1 and the inductor M2 shown in FIG. 3 and FIG. 4. FIG. 5 shows a part of coils formed in a circular shape as the inductors M1 and M2. Further, a signal SIG1 input into the inductor M1 and a signal SIG2 output from the inductor M2 are represented by thick arrows, and a plurality of magnetic force lines MGL penetrating the inductor M1 and the inductor M2 is represented by two-dot chain lines.

As described above, the semiconductor chip CP1 and the semiconductor chip CP2 configure a pair of coupling devices that transmits signals between the semiconductor chips using inductive coupling of the inductors. The signals are transmitted using inductive coupling of the inductors between, for example, a power conversion circuit INV (see FIG. 5) that supplies driving electric power for load such as a motor and a control circuit CTL (see FIG. 5) that controls the operation of the power conversion circuit. A relatively-large current flows in the power conversion circuit INV because electric power for driving the load flows. On the other hand, a current smaller than that of the power conversion circuit INV flows in the control circuit CTL. In this case, when the power conversion circuit INV is electrically coupled to the control circuit CTL, noise is generated in the control circuit CTL. Thus, the power conversion circuit INV and the control circuit CTL are electrically insulated by inserting the insulating film IL1 (see FIG. 2) therebetween, and an inductive coupling device having a function of transmitting signals from the control circuit CTL to the power conversion circuit INV is inserted therebetween. Accordingly, the reliability of a power conversion system can be improved.

In the case where signals are transmitted using inductive coupling, the inductor M1 for transmission (sending) and the inductor M2 for reception are arranged so as to face each other as shown in FIG. 5. When the signal SIG1 (for example, a control signal input from the control circuit CTL) is input to the inductor M1 for transmission of the semiconductor chip CP1, a current flows into the inductor M1 that is a coil. Accordingly, the magnetic force lines MGL penetrating the inductor M1 are generated. When the magnetic force lines MGL penetrate the inductor M2 of the semiconductor chip CP2, magnetic flux penetrating the inductor M2 that is a coil is changed. Thus, induced electromotive force is generated in accordance with the change in the magnetic flux per unit time. In addition, the signal SIG2 can be output on the basis of the induced electromotive force generated in the inductor M2. The signal SIG2 output from the inductor M2 is input to the power conversion circuit INV as a control signal that controls the operation of the power conversion circuit INV as shown in, for example, FIG. 5.

As described above, the pair of coupling devices that transmits signals between the semiconductor chips using inductive coupling of the inductors has a structure in which the signal SIG1 that is an electric signal is converted into a signal of a change in the magnetic flux penetrating the inductors M1 and M2, and the signal of a change in the magnetic flux is converted into the signal SIG2 that is an electric signal again, so that the signal transmission routes of the inductor M1 and the inductor M2 are coupled.

Specifically, in order to transmit signals between the semiconductor chips using inductive coupling, it is necessary to allow the magnetic force lines MGL generated when a signal is input to the inductor M1 for transmission to penetrate the inductor M2 for reception. Therefore, as shown in FIG. 2 and FIG. 6, the semiconductor chip CP2 is mounted on the semiconductor chip CP1 so that the inductor M2 for reception used for signal transmission is overlapped with the inductor M1 for transmission (sending) of the semiconductor chip CP1. Further, the inductor M3 for reception of the semiconductor chip CP1 is also overlapped with the inductor M4 for transmission of the semiconductor chip CP2 in planar view in the example of the embodiment.

By the way, as shown in FIG. 5, in the case where signals are transmitted using the magnetic force lines MGL penetrating the inductor M1 for transmission and the inductor M2 for reception, the value of the induced electromotive force becomes larger as the amount of change in the magnetic flux per unit time is larger. In addition, in order to improve the conversion efficiency when an input signal is converted into an output signal through the signal of a change in the magnetic flux, it is preferable to adjust a positional relation between the inductors M1 and M2 so that many of the magnetic force lines MGL generated when the signal SIG1 is input penetrate the inductor M2.

For example, the centers of the inductor M1 and the inductor M2 that are coils match each other in planar view in the examples shown in FIG. 2 and FIG. 6. Further, the centers of the inductor M3 and the inductor M4 match each other. As described above, if the central positions of the coil for reception and the coil for transmission match each other in planar view, the number of magnetic force lines MGL (see FIG. 5) penetrating the both of the inductor M1 and the inductor M2 is increased. Therefore, it is possible to improve the conversion efficiency when an input signal is converted into an output signal through the signal of a change in the magnetic flux. Further, if the amount of change in the magnetic flux becomes large by improving the above-described conversion efficiency, a margin for correctly transmitting signals can be largely secured. Accordingly, the reliability of signal transmission can be improved.

Thus, from the viewpoint of improving the conversion efficiency of signals or of improving the reliability of signal transmission, the shift amount between the central positions of the inductor M1 and the inductor M2 is preferably smaller. However, if the inductor M1 is partially overlapped with the inductor M2 in planar view, some magnetic force lines MGL penetrate the inductor M2, and thus signals can be transmitted using inductive coupling.

Further, from the viewpoint of stabilizing the signal transmission using inductive coupling of the inductor M1 and the inductor M2, a clearance between the inductor M1 and the inductor M2 is preferably controlled. Therefore, the inductor M1 and the inductor M2 are formed on the top surface CPt sides of the semiconductor chips CP1 and CP2, respectively, as shown in FIG. 2, and the top surfaces CPt of the semiconductor chips CP1 and CP2 face each other. Accordingly, the clearance between the inductor M1 and the inductor M2 can be controlled using the thickness of the insulating film IL1 arranged between the semiconductor chip CP1 and the semiconductor chip CP2.

Further, in the case where the top surface CPt of the semiconductor chip CP1 is allowed to face the top surface CPt of the semiconductor chip CP2 as in the embodiment, when the semiconductor chip CP1 is completely overlapped with the semiconductor chip CP2, the wires BW cannot be coupled to the pads PD of the semiconductor chip CP1 and the pads PD of the semiconductor chip CP2. For example, the dimension of the top surface CPt of the semiconductor chip CP1 is the same as that of the top surface CPt of the semiconductor chip CP2 in the embodiment. However, when the semiconductor chip CP2 is mounted on the semiconductor chip CP1 so that the centers thereof match each other, the pads PD are not exposed.

Accordingly, the position of the semiconductor chip CP1 is shifted from that of the semiconductor chip CP2 in planar view as shown in FIG. 3 in the embodiment, and thus the pads PD of the semiconductor chip CP1 and the pads PD of the semiconductor chip CP2 are exposed.

Here, as a method in which the pads PD are not overlapped with those of the other semiconductor chip CP1 or CP2 by shifting the planar positions of the semiconductor chip CP1 and the semiconductor chip CP2 from each other, there is a possible method in which the planar positions are shifted from each other along the extending direction (the X direction that is the extending direction of a side S12 and a side S14 in FIG. 19) of two sides facing each other among four sides of the semiconductor chip CP1 as in the study example shown in FIG. 19. In this case, among the four sides of the top surface CPt of the semiconductor chip CP1, one side (a side S11 in FIG. 19) intersecting with the shift direction of the semiconductor chips CP1 and CP2 is not overlapped with the other semiconductor chip CP2, and thus the pads PD can be arranged along the side S11. Further, among the four sides of the top surface CPt of the semiconductor chip CP2, one side (a side S23 in FIG. 19) intersecting with the shift direction of the semiconductor chips CP1 and CP2 is not overlapped with the other semiconductor chip CP1, and thus the pads PD can be arranged along the side S23. However, in the case where there is only one side along which the pads PD can be arranged, the number of aligned pads PD, namely, the number of terminals of the semiconductor chips CP1 and CP2 is restricted.

Accordingly, the planar positions of the semiconductor chip CP1 and the semiconductor chip CP2 are shifted from each other along the directions intersecting with the extending directions (the X direction and the Y direction in FIG. 3) of the four sides of the semiconductor chip CP1 as shown in FIG. 3 in the embodiment. Accordingly, the pads PD can be arranged along the two sides intersecting with each other among the four sides of the semiconductor chip CP1. Further, the pads PD can be arranged along the two sides intersecting with each other among the four sides of the semiconductor chip CP2.

Specifically, the pads PD are aligned along the two sides intersecting with each other among the four sides of the top surface CPt as shown in FIG. 4. The top surface CPt of the semiconductor chip CP1 has a side (a chip side) S11, a side (chip side) S12 intersecting with the side S11, a side (chip side) S13 facing the side S11, and a side (chip side) S14 facing the side S12. Among these sides, the pads PD of the semiconductor chip CP1 are provided so as to be aligned along the side S11 and the side S12 intersecting with each other. On the other hand, no pads PD are provided in the rows along the side S13 and the side S14 of the top surface CPt of the semiconductor chip CP1. Further, the top surface CPt of the semiconductor chip CP2 has a side (chip side) S21, a side (chip side) S22 intersecting with the side S21, a side (chip side) S23 facing the side S21, and a side (chip side) S24 facing the side S22. Among these sides, the pads PD of the semiconductor chip CP2 are provided so as to be aligned along the side S23 and the side S24 intersecting with each other. On the other hand, no pads PD are provided in the rows along the side S21 and the side S22 of the top surface CPt of the semiconductor chip CP2.

As described above, the pads PD can be arranged along the two sides of the top surface CPt of each of the semiconductor chip CP1 and the semiconductor chip CP2 in the embodiment. Thus, the number of terminals can be increased as compared to the study example shown in FIG. 19. Further, when the number of terminals of each of the semiconductor chip CP1 and the semiconductor chip CP2 is increased, the following effect can be obtained. Specifically, in the case where the number of signal terminals is increased, the number of types of signals that can be handled can be increased. Thus, the function of the semiconductor device PKG1 can be improved. Further, in the case where the number of terminals for supplying the power supply potential is increased, the cross-sectional area of the supplying route of the power supply potential can be increased. Thus, the power supplying route can be stabilized.

Further, each of the pads PD of the semiconductor chip CP2 is not overlapped with the die pad DP in planar view as shown in FIG. 3. The wires BW can be coupled in some cases depending on the thicknesses of the semiconductor chip CP1 and the insulating film IL1 even when the pads PD of the semiconductor chip CP2 are overlapped with the die pad DP in the thickness direction. However, if the easiness of coupling of the wires BW is considered, each of the pads PD of the semiconductor chip CP2 is not preferably overlapped with the die pad DP in planar view as in the embodiment.

In order not to overlap the pads PD of the semiconductor chip CP2 with the die pad DP in the embodiment, the semiconductor chip CP1 is mounted close to one corner part DPc1 on the upper surface DPt of the die pad DP having four sides as shown in FIG. 6. In other words, the semiconductor chip CP1 is mounted on the die pad DP in such a manner that a distance to one corner part DPc1 of two corner parts of the die pad DP is shorter than that to the other corner part DPc2. In addition, the pads PD of the semiconductor chip CP2 are provided outside a side DPs3 and a side DPs4 intersecting at the corner part DPc1 among the four sides of the die pad DP in planar view. Further, the pads PD of the semiconductor chip CP1 are provided inside a side DPs1 and a side DPs2 that do not intersect at the corner part DPc1 among the four sides of the die pad DP, and no pads PD of the semiconductor chip CP2 are provided. Accordingly, each of the pads PD of the semiconductor chip CP2 is not overlapped with the die pad DP in planar view.

Further, no hanging leads HL are coupled to the corner part DPc1 covered with the semiconductor chip CP2 in planar view among the four corner parts of the die pad DP as shown in FIG. 6 in the embodiment.

Specifically, the die pad DP has the side (base material side) DPs1, the side (base material side) DPs2 that extends in the direction intersecting with the side DPs1, the side (base material side) DPs3 facing the side DPs1, and the side (base material side) DPs4 that faces the side DPs2 and extends in the direction intersecting with the side DPs3. Further, the die pad DP has the corner part DPc1 formed by the side DPs3 and the side DPs4 and the corner part DPc2 formed by the side DPs1 and the side DPs2. Further, the semiconductor chip CP2 is mounted on the semiconductor chip CP1 so as to be overlapped with the corner part DPc1 in first planar view viewed from the top surface CPt side of the semiconductor chip CP1. Further, the hanging leads HL are coupled to parts other than the corner part DPc1 and the corner part DPc2 of the die pad DP. In the example shown in FIG. 6, one of two hanging leads HL coupled to the die pad DP is coupled to an end part of the side DPs1 and an end part of the side DPs4. Further, the other of two hanging leads HL coupled to the die pad DP is coupled to an end part of the side DPs2 and an end part of the side DPs3.

In the case where signals are transmitted using inductive coupling as in the embodiment, the effect of parasitic capacity or the like causing a noise source is preferably reduced in order to stabilize the signal transmission. However, in the case where the semiconductor chips CP1 and CP2 having the inductors face a metal plate through an insulating layer, the parasitic capacity is likely to be formed between the metal plate and the semiconductor chips CP1 and CP2.

In the case where the hanging leads HL and the semiconductor chip CP2 are arranged so as to face each other through the insulating layer as in the embodiment, the parasitic capacity generated between the hanging leads HL and the semiconductor chip CP2 causes a noise source of signal transmission. Accordingly, no hanging leads HL are coupled to the corner part DPc1 covered with the semiconductor chip CP2 in planar view in the embodiment. Accordingly, the signal transmission can be stabilized by suppressing the parasitic capacity from being formed between the semiconductor chip CP2 and the hanging leads HL.

It should be noted that no hanging leads HL are coupled to the corner part DPc2 positioned at the opposing corner of the corner part DPc1 of the die pad DP in the example shown in FIG. 6. However, since the corner part DPc2 is not covered with the semiconductor chip CP2, the hanging leads HL may be coupled to the corner part DPc2 as a modified example of FIG. 6. In this case, the die pad DP is supported in three directions, and thus the supporting strength of the semiconductor chips CP1 and CP2 can be improved. On the other hand, in the case of the structure in which no hanging leads HL are coupled to the corner part DPc2 as shown in FIG. 6, material to be used can be reduced by reducing the number of hanging leads HL. Alternatively, the weight of the package can be reduced by reducing the number of hanging leads HL.

Further, in the case where a part of the semiconductor chip CP2 is mounted so as to be projected outside the side DPs3 and the side DPs4 intersecting at one corner part DPc1 of the die pad DP as in the embodiment, the parasitic capacity between the die pad DP and the semiconductor chip CP2 can be reduced by reducing the area of a region facing the projected part of the semiconductor chip CP2 in the die pad DP. As described above, the semiconductor chip CP1 is mounted close to one corner part DPc1 on the upper surface DPt of the die pad DP having the four sides in the embodiment. Accordingly, the area of the region facing the projected part of the semiconductor chip CP2 in the die pad DP can be reduced, and thus the parasitic capacity between the die pad DP and the semiconductor chip CP2 can be reduced. For example, the area of a part where the projected part is overlapped with the die pad DP is smaller than the area of a part where the projected part is not overlapped with the die pad DP in a part of the semiconductor chip CP2 projected outside the semiconductor chip CP1 in planar view in the example shown in FIG. 6.

Further, in order to reduce the area of the region facing the projected part of the semiconductor chip CP2 in the die pad DP, the following relation is established in the embodiment. Specifically, the side S13 of the semiconductor chip CP1, the side DPs3 of the die pad DP, and the side S23 of the semiconductor chip CP2 are arranged so as to extend along each other in planar view. In this case, a distance (width) WD1 from the side S13 of the semiconductor chip CP1 to the side DPs3 of the die pad DP is smaller than a distance (width) WD2 from the side S23 of the semiconductor chip CP2 to the side DPs3 of the die pad DP. Likewise, the side S14 of the semiconductor chip CP1, the side DPs4 of the die pad DP, and the side S24 of the semiconductor chip CP2 are arranged so as to extend along each other. In this case, a distance (width) WD3 from the side S14 of the semiconductor chip CP1 to the side DPs4 of the die pad DP is smaller than a distance (width) WD4 from the side S24 of the semiconductor chip CP2 to the side DPs4 of the die pad DP. In the example shown in FIG. 6, each of the distance WD1 and the distance WD3 is about 0.15 mm, and each of the distance WD2 and the distance WD4 is about 0.5 mm.

Further, the wires BW are coupled to a part of the die pad DP as shown in FIG. 3 in the embodiment. Therefore, the die pad DP needs a space to which the wires BW are coupled, namely a region where no semiconductor chip CP1 is mounted.

In order to provide a part to which the wires BW are coupled in the die pad DP and to reduce the area of the region facing the projected part of the semiconductor chip CP2 in the embodiment, the wires BW are provided on the side opposite to the projected part of the semiconductor chip CP2. Further, spaces to which the wires BW (see FIG. 3) are coupled are provided between the side DPs1 and the side S11 of the semiconductor chip CP1 and between the side DPs2 and the side S12 of the semiconductor chip CP1 in the die pad DP in the example shown in FIG. 6. Further, each of a distance WD5 from the side DPs1 of the die pad DP to the side S11 of the semiconductor chip CP1 and a distance WD6 from the side DPs2 of the die pad DP to the side S12 of the semiconductor chip CP1 is about 0.7 mm. As described above, each of the distances WD5 and WD6 is larger than each of the distances WD1 and WD3.

It should be noted that the respective leads LD shown in FIG. 3 may be coupled to the pads PD of the semiconductor chip CP1 without coupling the wires BW to the die pad DP as a modified example of the embodiment. In this case, for example, the power supply potential and the reference potential are supplied from the pads PD, and thus no back surface electrodes may be formed on the back surface CPb (see FIG. 2) of the semiconductor chip CP1. Likewise, the respective leads LD shown in FIG. 3 may be coupled to the pads PD of the semiconductor chip CP2 without coupling the wires BW to the back surface CPb of the semiconductor chip CP2 as a modified example of the embodiment. In this case, for example, the power supply potential and the reference potential are supplied from the pads PD, and thus no back surface electrodes may be formed on the back surface CPb (see FIG. 2) of the semiconductor chip CP2.

In this case, it is not necessary to provide a space to which the wires BW are coupled in the die pad DP, and thus the area of the die pad DP may be small. For example, although not illustrated, the area of the die pad DP may be smaller than that of the back surface CPb (see FIG. 2) of the semiconductor chip CP1.

However, in the case where the back surface electrodes are used as terminals for supplying the reference potential and the power supply potential to the semiconductor chips CP1 and CP2 as described above, the cross-sectional area of the potential supplying route is increased, and thus the potential can be stabilized. Specifically, if the reference potential and the power supply potential are supplied to the back surface electrodes whose area is larger than that of the pad PD, it is possible to avoid the concentration of electric fields. In particular, the semiconductor device that transmits signals using inductive coupling of the inductors as the semiconductor device PKG1 of the embodiment is used in some cases as a coupler (coupling device) that couples the primary circuit (control circuit CTL) of the power conversion system to the secondary circuit (power conversion circuit INV) as in the example shown in FIG. 5. In this case, the reliability of the semiconductor device PKG1 as a coupler can be improved by stabilizing the potential supplying route of the semiconductor device PKG1.

Thus, from the viewpoint of stabilizing the potential supplying route by avoiding the concentration of electric fields of potential supplied to the semiconductor chip CP1, the wires BW are preferably coupled to the die pad DP. Further, the wires BW are preferably coupled to the back surface CPb of the semiconductor chip CP2.

Further, in order to improve the conversion efficiency when an input signal is converted into an output signal through the signal of a change in the magnetic flux, many of the magnetic force lines MGL generated when the signal SIG1 shown in FIG. 5 is input preferably penetrate the inductor M2 as described above. Thus, from the viewpoint of improving the signal conversion efficiency, enlarging the area where the semiconductor chip CP1 and the semiconductor chip CP2 shown in FIG. 6 are overlapped with each other is advantageous. In the example shown in FIG. 6, the area of a region on the top surface CPt of the semiconductor chip CP1 that is overlapped with the semiconductor chip CP2 is larger than that on the top surface CPt of the semiconductor chip CP1 that is not overlapped with the semiconductor chip CP2. Thus, the signal conversion efficiency can be improved because the winding diameters of the inductors M1 and M2 that are coils can be increased.

However, for example, the planar size of each of the semiconductor chips CP1 and CP2 cannot be sufficiently increased in some cases due to the reason of the planar size of the semiconductor package and the like. In this case, the area of a region on the top surface CPt of the semiconductor chip CP1 that is overlapped with the semiconductor chip CP2 may be smaller than that on the top surface CPt of the semiconductor chip CP1 that is not overlapped with the semiconductor chip CP2. Further, in this case, if the current of the signal SIG1 input to the inductor M1 shown in FIG. 5 is increased, the density of magnetic flux is increased. Thus, the reliability of the signal transmission can be improved although the power consumption is increased.

Further, in order to stabilize the signal transmission using the inductor M1 and the inductor M2 shown in FIG. 5, the clearance between the inductor M1 and the inductor M2 is preferably set to the same value by controlling the clearance. Accordingly, as described above, the inductor M1 and the inductor M2 are formed on the top surface CPt sides of the semiconductor chips CP1 and CP2, respectively, as shown in FIG. 2, and the top surfaces CPt of the semiconductor chips CP1 and CP2 face each other. Accordingly, the clearance between the inductor M1 and the inductor M2 can be controlled using the thickness of the insulating film IL1 arranged between the semiconductor chip CP1 and the semiconductor chip CP2.

Figure 7:
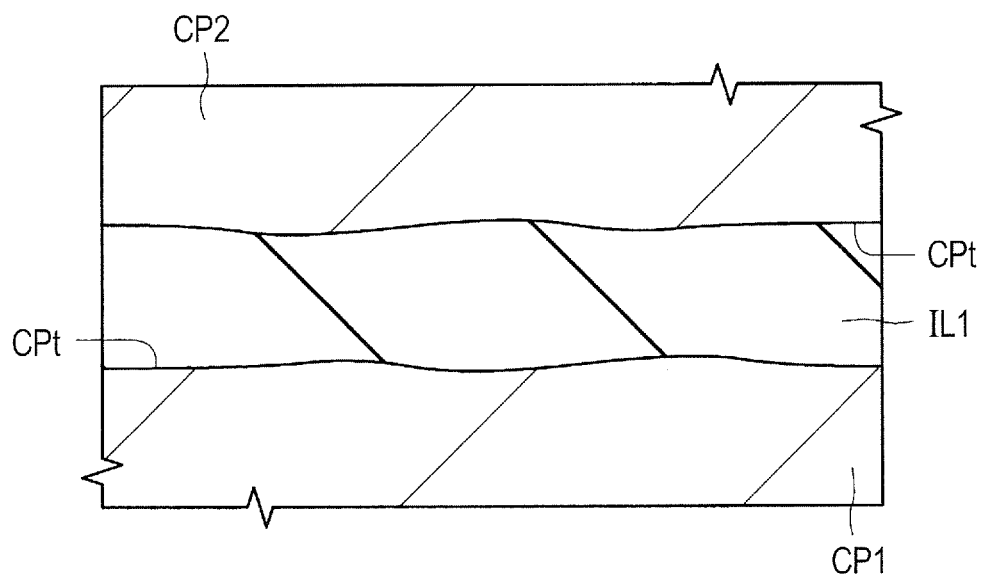
FIG. 7 is an enlarged cross-sectional view for showing an enlarged portion between the laminated semiconductor chips shown in FIG. 2.

However, each of the top surface CPt of the semiconductor chip CP1 and the top surface CPt of the semiconductor chip CP2 has minute irregularities as shown in FIG. 7. FIG. 7 is an enlarged cross-sectional view for showing an enlarged portion between the laminated semiconductor chips shown in FIG. 2. Further, FIG. 8 is an enlarged cross-sectional view for showing a modified example of the insulating film shown in FIG. 7.

As shown in FIG. 7, each of the top surface CPt of the semiconductor chip CP1 and the top surface CPt of the semiconductor chip CP2 has irregular faces. The irregularities are formed as a result of rising of an outermost passivation film after the shape of a conductor pattern such as wirings formed under the top surface CPt. Therefore, in order to control the clearance between the semiconductor chip CP1 and the semiconductor chip CP2, it is preferable to use material that can be suitably embedded into the irregularities as the insulating film IL1.

For example, the insulating film IL1 is a film-like organic insulating film made of resin such as polyimide in the example shown in FIG. 7. The organic insulating film is lower in elasticity than an inorganic insulating film, and thus is likely to be deformed after the irregularities of the top surface CPt. Therefore, the clearance between the semiconductor chip CP1 and the semiconductor chip CP2 can be easily controlled irrespective of the degree of the irregularities of the top surface CPt. It should be noted that as a method of bonding and fixing the semiconductor chips together that are arranged so as to face each other, there is a method in which paste-like resin is applied and extended between the semiconductor chip CP1 and the semiconductor chip CP2 followed by curing. However, in the case of the method of extending the paste-like resin, the thickness is likely to vary depending on the degree of the progress of the resin. Thus, the method of sandwiching and bonding a preliminarily-molded resin film between the semiconductor chips CP1 and CP2 is preferable because the value of the insulating film IL1 can be kept constant.

Figure 8:
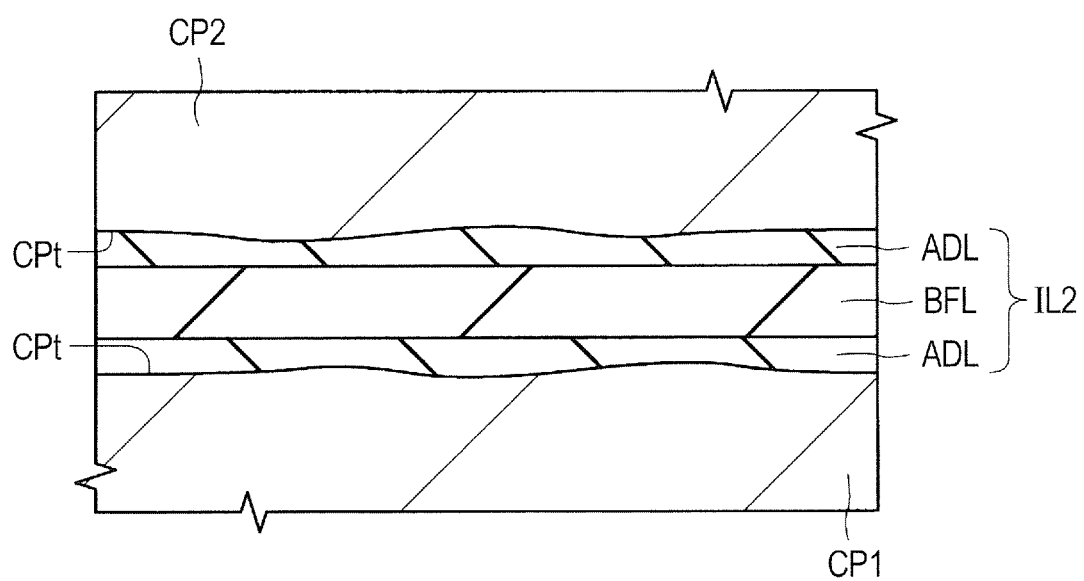
FIG. 8 is an enlarged cross-sectional view for showing a modified example of an insulating film shown in FIG. 7.

Further, as a modified example of the insulating film IL1 shown in FIG. 7, an organic insulating film having a structure in which both surfaces of a base material layer BFL are covered with adhesive layers ADL that are easily deformed as compared to the base material layer BFL as an insulating film IL2 shown in FIG. 8 may be used. In this case, since the adhesive layers ADL are deformed first, the embedding characteristics for the irregularities of the top surface CPt are improved. Further, since the base material layer BFL is less deformed as compared to the adhesive layers ADL, a constant thickness can be easily kept. Therefore, the entire thickness of the insulating film IL2 can be easily controlled.

<Manufacturing Method of Semiconductor Device>

Figure 9:
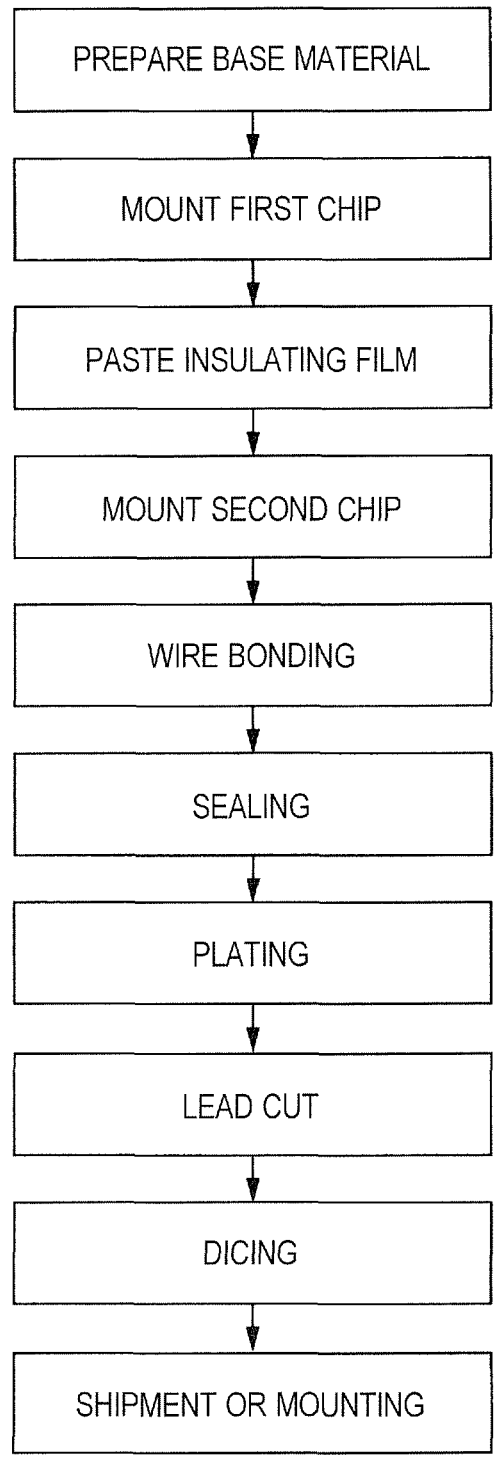
FIG. 9 is an explanatory view for showing a flow of assembly processes of the semiconductor device described using FIG. 1 to FIG. 8.

Next, a manufacturing method of the semiconductor device PKG1 described using FIG. 1 to FIG. 8 will be described using a flowchart shown in FIG. 9. FIG. 9 is an explanatory view for showing a flow of assembly processes of the semiconductor device described using FIG. 1 to FIG. 8.

Further, FIG. 9 shows main processes among the manufacturing processes of the semiconductor device PKG1, but various modified examples can be applied other than the assembly flow shown in FIG. 9. For example, a marking process in which a product identification mark is formed in the sealing body MR is not illustrated in FIG. 9, but can be added between a sealing process and a plating process. Further, for example, an inspection process is not illustrated in FIG. 9, but may be added after, for example, a dicing process.

<Base Material Preparation Process>

Figure 10:
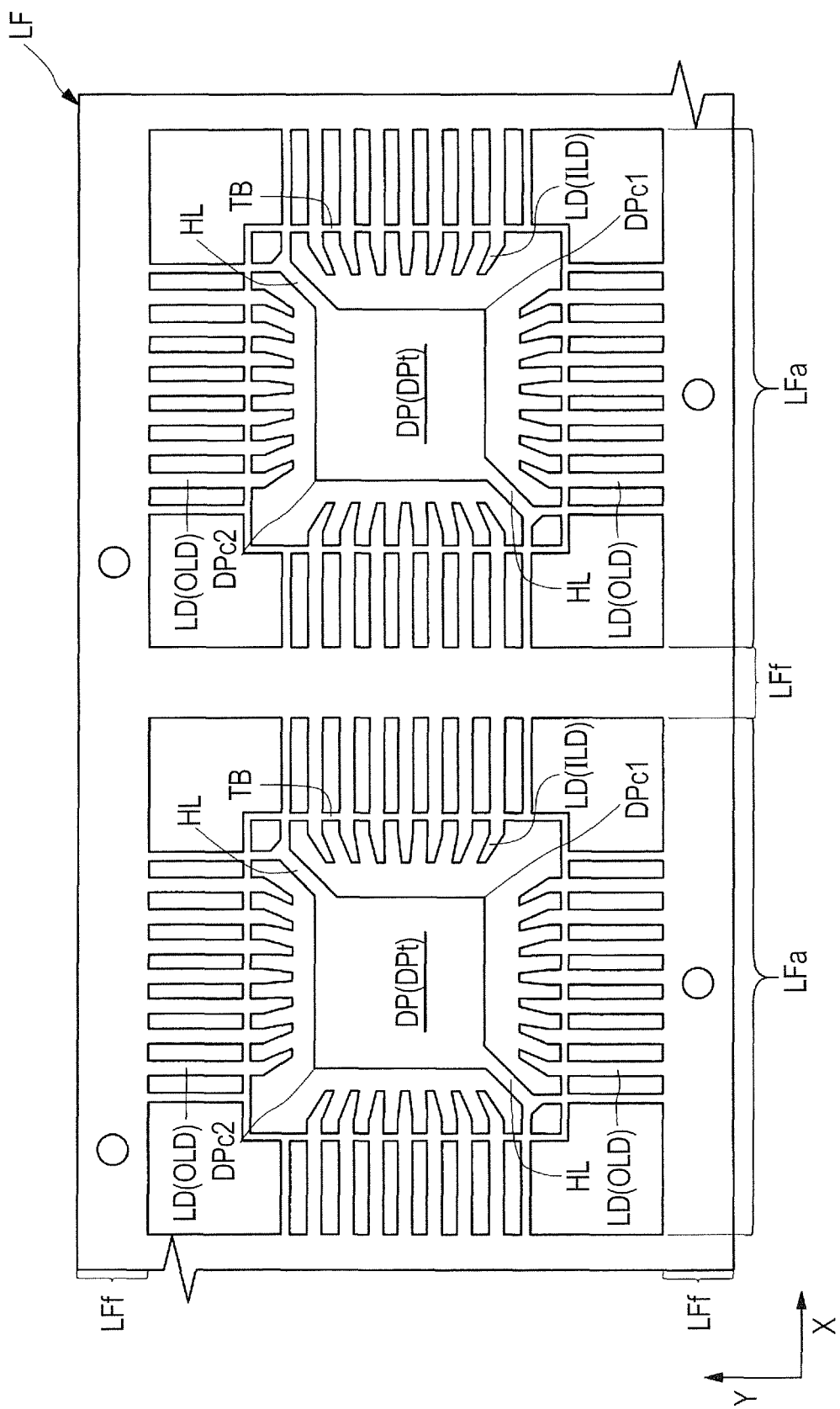
FIG. 10 is an enlarged plan view for showing a part of a lead frame prepared in a base material preparation process shown in FIG. 9.

In a base material preparation process shown in FIG. 9, a lead frame LF shown in FIG. 10 is prepared. FIG. 10 is an enlarged plan view for showing a part of the lead frame prepared in the base material preparation process shown in FIG. 9.

As shown in FIG. 10, the lead frame LF prepared in the process includes a plurality of device regions LFa inside a frame part LFf. The lead frame LF is made of metal, and is made of metal composed mainly of, for example, copper (Cu) in the embodiment.

It should be noted that an example in which the plating process is performed after the sealing process as shown in FIG. 9 and the metal film MC shown in FIG. 2 is formed at the outer lead parts OLD will be described in the embodiment. However, as a modified example, the surface of the base material composed mainly of copper may be covered with the metal film MC in advance in the stage of the base material preparation process. In this case, the entire exposed surface of the lead frame LF is covered with the metal film MC.

Further, the die pad DP that is a chip mounting part is formed in the middle of each device region LFa as shown in FIG. 10. The hanging leads HL are coupled to each die pad DP, and are arranged so as to extend towards the corner parts of the device regions LFa. Each die pad DP is supported by the frame part LFf of the lead frame LF through the hanging leads HL.

As described above, no hanging leads are coupled to the corner part DPc1 and the corner part DPc2 positioned at the opposing corner of the corner part DPc1 among the four corner parts of the die pad DP in planar view in the embodiment.

Further, the leads LD are formed between the hanging leads HL around the die pad DP. The respective leads LD are coupled to the frame part LFf. In the example of the embodiment, the leads LD are provided around the die pad DP, and are formed so as to extend in four directions.

Further, the leads LD are connected to each other through a tie bar TB. The tie bar TB has a function as a dam member for suppressing a leakage of resin in the sealing process shown in FIG. 9 in addition to a function as a connecting member for connecting the leads LD.

The tie bar TB is provided so as to surround the circumference of each die pad DP. Further, since the semiconductor device of the embodiment is a QFP-type semiconductor device as described above, the outer lead parts OLD protrude outside the tie bar TB relative to each die pad DP. In the example shown in FIG. 10, four groups of leads in which the outer lead parts OLD protrude in four directions from the center of each die pad DP are provided. In addition, each group of leads is coupled to the frame part LFf supporting the die pad DP and the leads LD.

<First Chip Mounting Process>

Figure 11:
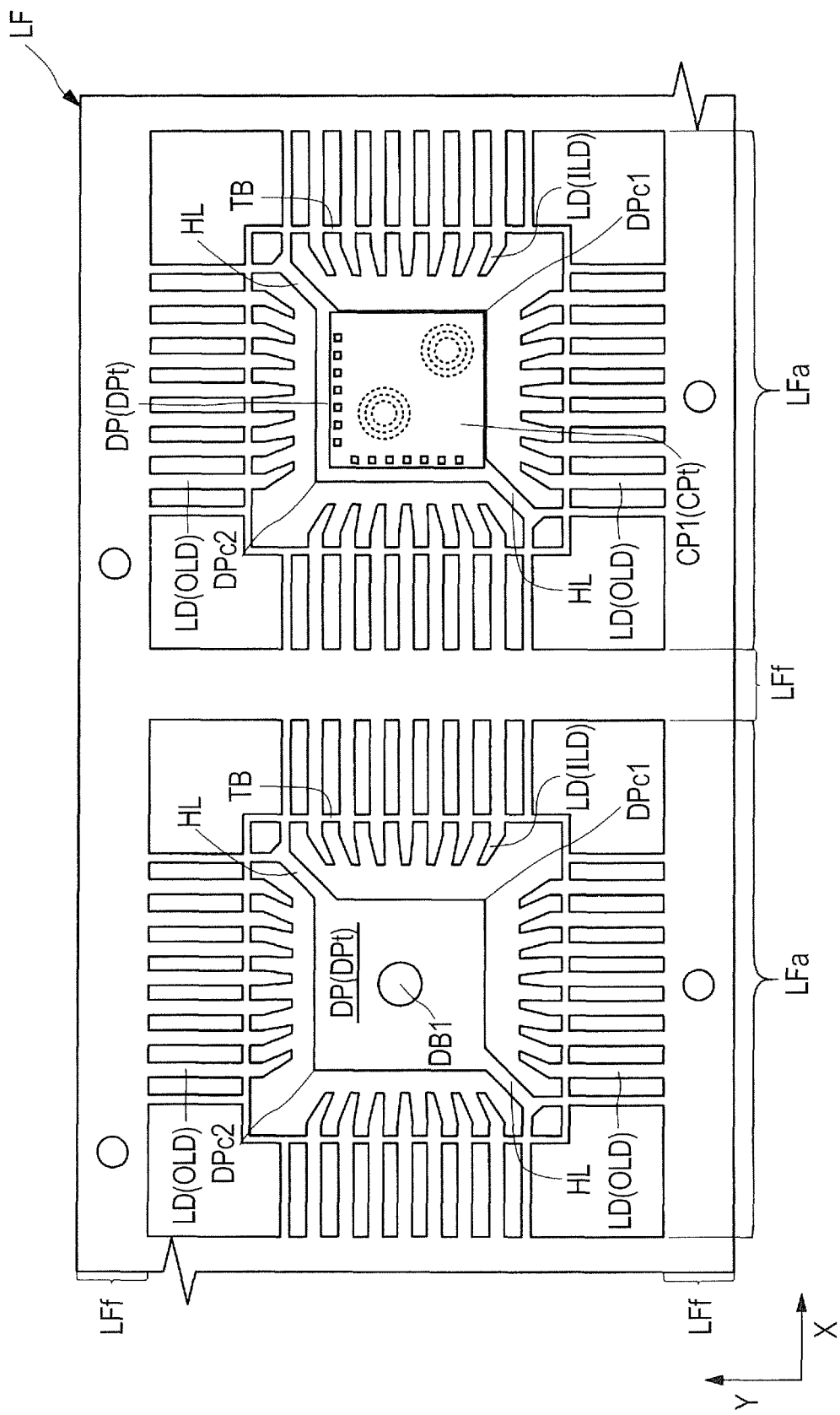
FIG. 11 is an enlarged plan view for showing a state in which a first semiconductor chip is mounted on each die pad of the lead frame shown in FIG. 10.

Next, in a first chip mounting process (first die bonding process) shown in FIG. 9, the semiconductor chip CP1 is mounted on each die pad DP as shown in FIG. 11. FIG. 11 is an enlarged plan view for showing a state in which a first semiconductor chip is mounted on each die pad of the lead frame shown in FIG. 10.

As described using FIG. 2, the semiconductor chip CP1 has the top surface CPt on which the pads PD are formed and the back surface CPb (see FIG. 2) located opposite to the top surface CPt. In this process, the semiconductor chip CP1 and the die pad DP are bonded and fixed to each other through the die bond material DB1 that is an adhesive made of thermosetting resin such as epoxy resin. Further, as shown in FIG. 2, the semiconductor chip CP1 is mounted on the die pad DP by a so-called face-up mounting method in the process so that the back surface CPb faces the upper surface DPt that is a chip mounting face of the die pad DP.

It should be noted that FIG. 11 shows an example in which the paste-like die bond material DB1 is applied to a part of the die pad DP, and then the semiconductor chip CP1 is pressed against the die pad DP for bonding.

Further, as described above, the wires BW (see FIG. 3) are coupled to a part of the die pad DP in a wire bonding process to be described later in the embodiment. Therefore, the area of the die pad DP is larger than the planar area of the semiconductor chip CP1 in consideration of a space to which the wires BW are coupled.

Further, the semiconductor chip CP1 is mounted not in the middle of the die pad DP but close to the corner part DPc1 to which no hanging leads HL are coupled among the four corner parts in the process. The corner part DPc1 is covered with the semiconductor chip CP2 (see FIG. 6) in a second chip mounting process to be described later. Therefore, no pads PD (see FIG. 6) are provided at the two sides (the side S13 and the side S14 shown in FIG. 6) arranged at positions relatively near the corner part DPc1 among the four sides of the semiconductor chip CP2. On the other hand, the pads PD (see FIG. 6) are provided at the two sides (the side S11 and the side S12 shown in FIG. 6) arranged at positions relatively far from the corner part DPc1 among the four sides of the semiconductor chip CP2.

<Insulating Film Pasting Process>

Figure 12:
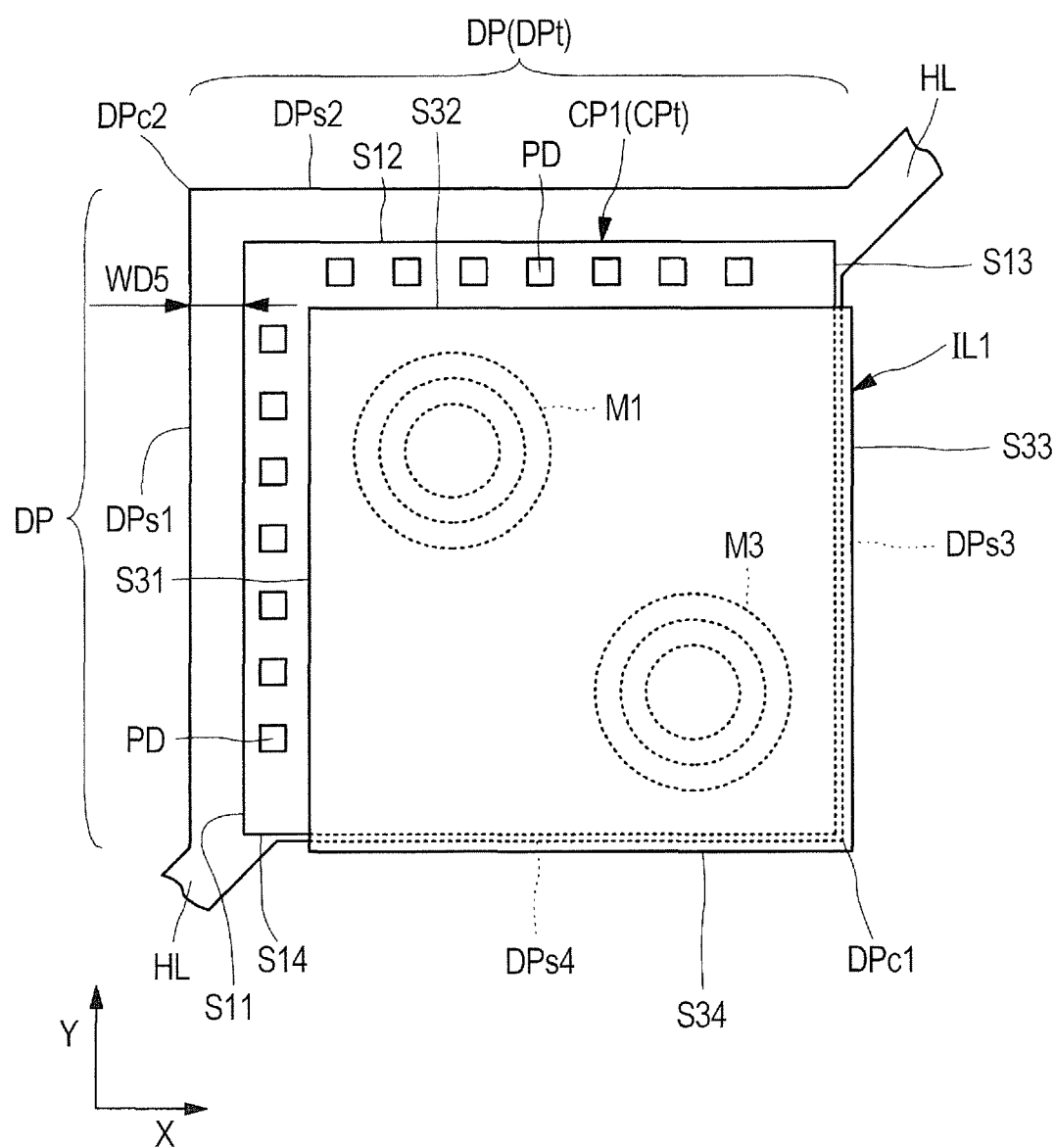
FIG. 12 is an enlarged plan view for showing a state in which the insulating film is pasted on the first semiconductor chip shown in FIG. 11.

Next, in an insulating film pasting process shown in FIG. 9, the insulating film IL1 is pasted on the semiconductor chip CP1 mounted on the die pad DP as shown in FIG. 12. FIG. 12 is an enlarged plan view for showing a state in which the insulating film is pasted on the first semiconductor chip shown in FIG. 11. It should be noted that FIG. 12 shows one die pad by enlarging the circumference thereof among the two die pads shown in FIG. 11 for easily viewing the drawing.

In the process, the insulating film IL1 is pasted on the top surface CPt of the semiconductor chip CP1. As described above, the insulating film IL1 is a film-like organic insulating film. In the embodiment, the insulating film IL1 is a film made of polyimide resin as described using FIG. 7.

The insulating film IL1 functions as an adhesive for bonding and fixing the semiconductor chip CP1 and the semiconductor chip CP2 shown in FIG. 2 to each other. Further, the insulating film IL1 functions as an insulating material for electrically insulating the inductors M1 and M3 and the inductors M2 and M4 shown in FIG. 2 from each other. Thus, as shown in FIG. 12, the insulating film IL1 is pasted on the top surface CPt of the semiconductor chip CP1 so that the pads PD arranged on the top surface CPt of the semiconductor chip CP1 are not overlapped with the other semiconductor chip CP2. Further, the insulating film IL1 is pasted so as to cover the inductor M1 and the inductor M3 formed on the top surface CPt side of the semiconductor chip CP1.

Further, each of the upper surface and the lower surface of the insulating film IL1 has a side S31, a side S32 intersecting with the side S31, a side S33 facing the side S31, and a side S34 facing the side S32. In addition, the insulating film IL1 is pasted in the process so that the pads PD of the semiconductor chip CP1 are exposed from the insulating film IL1. Therefore, as shown in FIG. 12, the pads PD are arranged between the side S31 of the insulating film IL1 and the side S11 of the semiconductor chip CP1 and between the side S32 of the insulating film IL1 and the side S12 of the semiconductor chip CP1. Further, the side S31 of the insulating film IL1 is positioned between the side S11 and the side S13 of the semiconductor chip CP1, and the side S32 of the insulating film IL1 is positioned between the side S12 and the side S14 of the semiconductor chip CP1.

Further, the insulating film IL1 is pasted so that a part of the insulating film IL1 is projected outside the top surface CPt of the semiconductor chip CP1 in the embodiment. Therefore, a part of the side S13 and a part of the side S14 of the semiconductor chip CP1 are covered with the insulating film IL1. Further, the corner part DPc1 of the die pad DP is covered with the insulating film IL1 in the example shown in FIG. 12. As described above, if the insulating film IL1 is pasted so that a part of the insulating film IL1 is projected outside the top surface CPt of the semiconductor chip CP1, electric insulation between the semiconductor chip CP1 and the semiconductor chip CP2 shown in FIG. 2 is improved. As a result, the reliability of signal transmission using inductive coupling can be improved.

<Second Chip Mounting Process>

Figure 13:
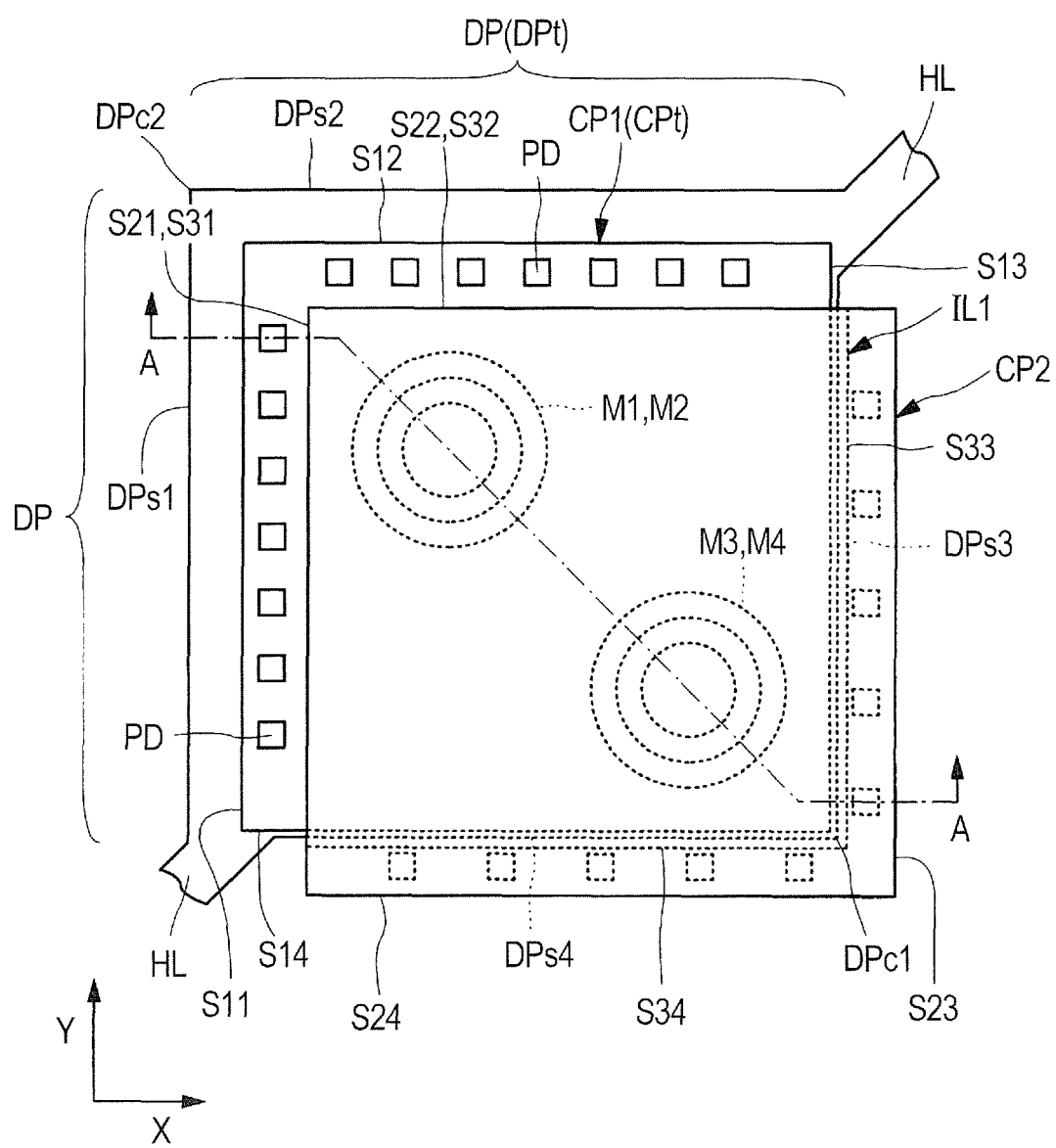
FIG. 13 is an enlarged plan view for showing a state in which a second semiconductor chip is mounted on the first semiconductor chip of the lead frame shown in FIG. 12.
Figure 14:
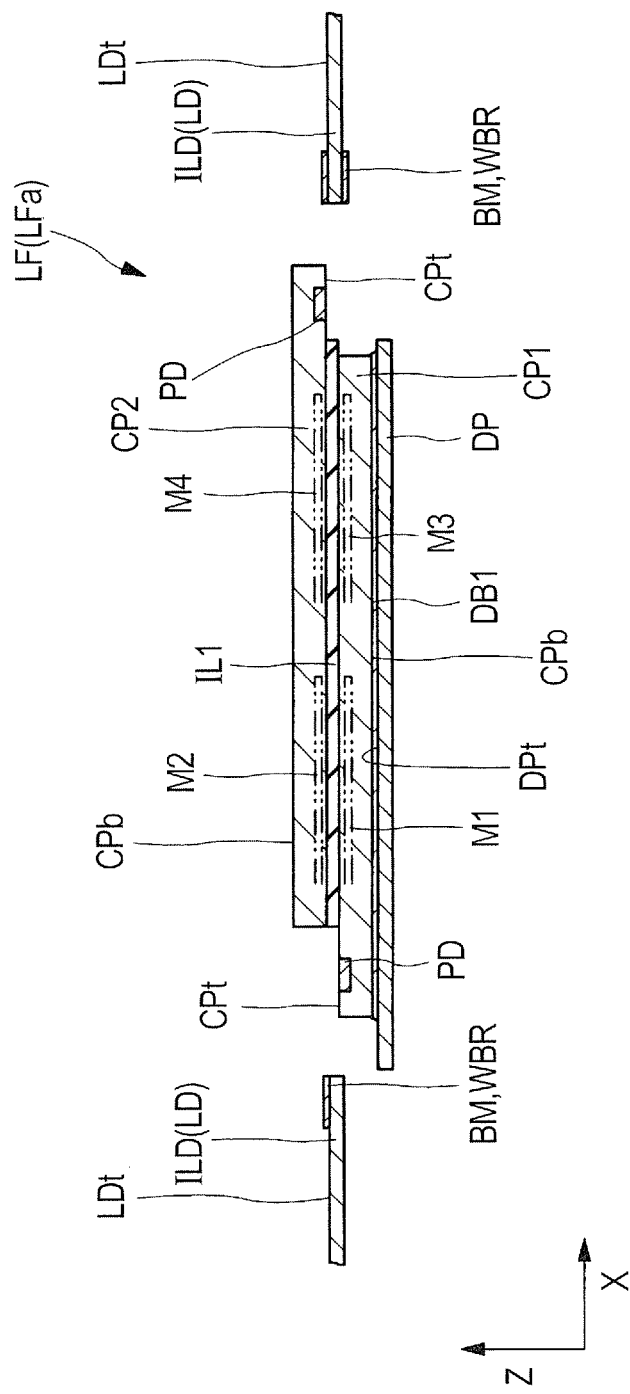
FIG. 14 is an enlarged cross-sectional view along the line A-A of FIG. 13.

Next, in a second chip mounting process (second die bonding process) shown in FIG. 9, the semiconductor chip CP2 is mounted on the semiconductor chip CP1 through the insulating film IL1 as shown in FIG. 13 and FIG. 14. FIG. 13 is an enlarged plan view for showing a state in which a second semiconductor chip is mounted on the first semiconductor chip of the lead frame shown in FIG. 12. Further, FIG. 14 is an enlarged cross-sectional view along the line A-A of FIG. 13.

The semiconductor chip CP2 has the top surface CPt on which the pads PD are formed and the back surface CPb (see FIG. 14) positioned opposite to the top surface CPt. In the process, the semiconductor chip CP2 is mounted on the insulating film IL1 pasted on the semiconductor chip CP1 in the insulating film pasting process, and the semiconductor chip CP1 and the semiconductor chip CP2 are bonded and fixed to each other. Further, the semiconductor chip CP2 is mounted on the insulating film IL1 so that the top surface CPt faces the insulating film IL1 in the process as shown in FIG. 14.

Further, the wires BW (see FIG. 3) are coupled to the pads PD of the semiconductor chip CP2 in a wire bonding process to be described later in the embodiment. Therefore, the semiconductor chip CP2 is mounted so that the pads PD of the semiconductor chip CP2 are exposed from the semiconductor chip CP1 and the insulating film IL1 (see FIG. 14) in the process.

Further, as shown in FIG. 14, it is preferable to reduce the area of a part where the top surface CPt of the semiconductor chip CP2 faces the die pad DP in a region of the semiconductor chip CP2 projected outside the semiconductor chip CP1. Therefore, the semiconductor chip CP2 is mounted so as to cover the corner part DPc1 of the die pad DP in planar view in the process as shown in FIG. 13. Further, the pads PD of the semiconductor chip CP2 are arranged between the side S23 of the semiconductor chip CP2 and the side DPs3 of the die pad DP and between the side S24 of the semiconductor chip CP2 and the side DPs4 of the die pad DP in planar view.

<Wire Bonding Process>

Figure 15:
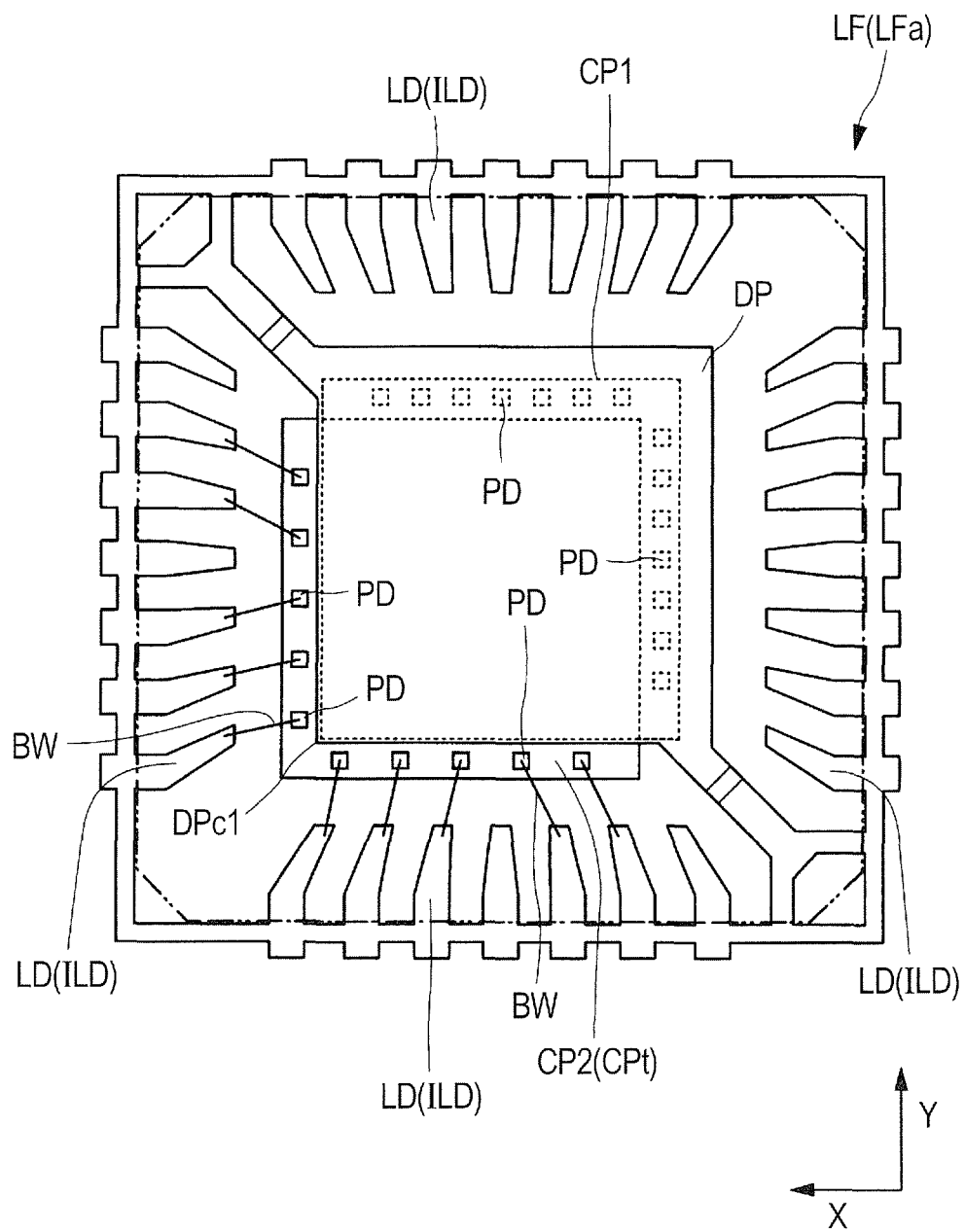
FIG. 15 is an enlarged plan view for showing every step of a wire bonding process shown in FIG. 9.
Figure 16:
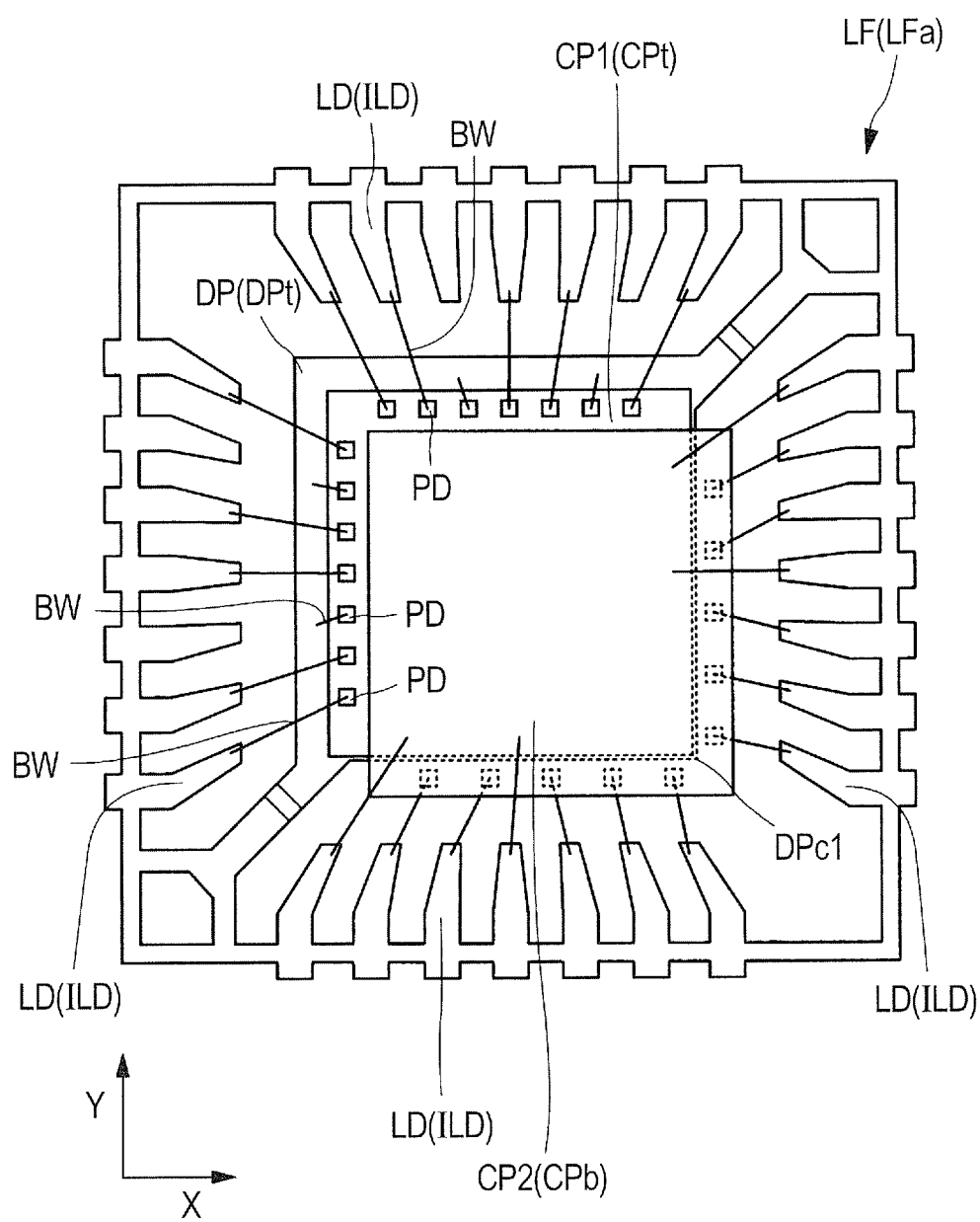
FIG. 16 is an enlarged plan view for showing every step of the wire bonding process shown in FIG. 9.

Next, in a wire bonding process shown in FIG. 9, the pads PD formed on the top surface CPt of each of the semiconductor chips CP1 and CP2 are electrically coupled to the leads LD provided around the die pad DP through the wires (conductive members) BW as shown in FIG. 16. FIG. 15 and FIG. 16 are enlarged plan views each showing every step of the wire bonding process shown in FIG. 9. It should be noted that in FIG. 15 and FIG. 16, the insulating film IL1 and the inductors M1, M2, M3, and M4 shown in FIG. 13 are not illustrated for easily viewing the drawings.

In the process, one end parts of the wires BW made of metal material such as, for example, gold (Au) or copper (Cu) are joined to the pads PD of the semiconductor chips CP1 and CP2 or the back surface electrodes provided on the back surface CPb of the semiconductor chip CP2 using a wire bonding tool (not shown). Further, the other end parts of the wires BW are joined to the inner lead parts ILD of the leads LD or the upper surface DPt of the die pad DP. The joint method includes, for example, a method in which ultrasonic waves are applied to a joint part to form metal joint, a method of thermocompression, or a method using both of the ultrasonic waves and the thermocompression.

Further, the surface of the semiconductor chip CP1 on which the pads PD are formed faces the surface of the semiconductor chip CP2 on which the pads PD are formed as shown in FIG. 15 in the embodiment. Therefore, in the wire bonding process, some leads LD are electrically coupled to the pads PD of the semiconductor chip CP2 through the wires BW as shown in FIG. 15. In this case, the wire bonding is performed in a state where the top surface CPt of the semiconductor chip CP2 faces upward by vertically reversing the lead frame LF shown in FIG. 14. Further, each of the wires BW coupled to the pads PD of the semiconductor chip CP2 is coupled to the lower surface side of the leads LD.

Next, the pads PD of the semiconductor chip CP1 are coupled to the leads LD through the wires BW by vertically reversing the lead frame LF. Further, some pads PD of the semiconductor chip CP1 are coupled to the die pad DP. Further, the back surface electrodes formed on the back surface CPb of the semiconductor chip CP2 are coupled to the leads LD.

<Sealing Process>

Figure 17:
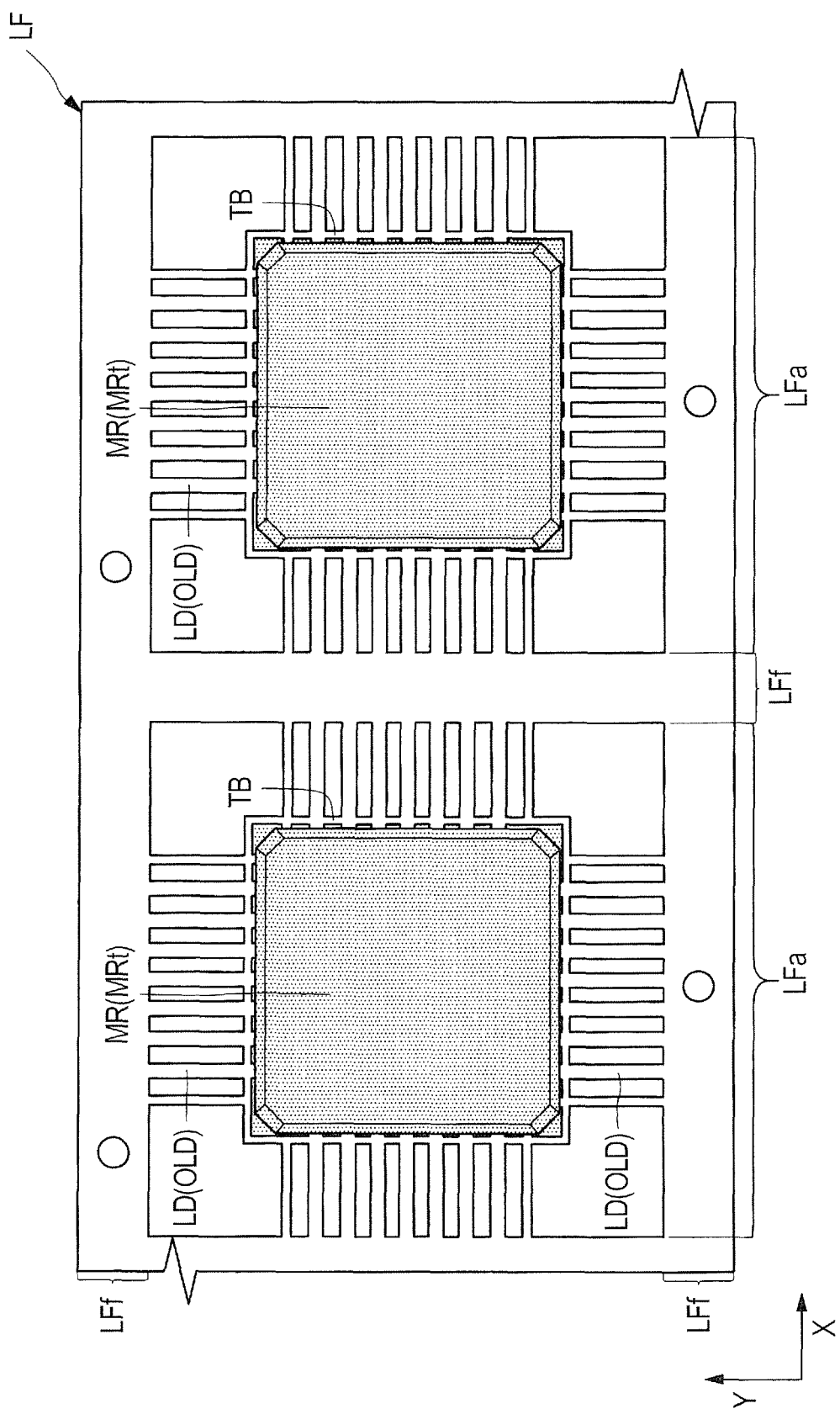
FIG. 17 is an enlarged plan view for showing a state in which the sealing body for sealing the semiconductor chips is formed in each of device regions shown in FIG. 16.

Next, in a sealing process shown in FIG. 9, the semiconductor chips CP1 and CP2, the wires BW, and the inner lead parts ILD of the leads LD shown in FIG. 15 are sealed with resin to form the sealing body MR shown in FIG. 17. FIG. 17 is an enlarged plan view for showing a state in which the sealing body for sealing the semiconductor chips is formed in each of the device regions shown in FIG. 16.

In the process, in a state where the lead frame LF is arranged in a molding die having a plurality of cavities to be described later, resin is supplied to a space formed by the cavities, and then the resin is hardened to form the sealing body (sealing part) MR. Such a method of forming the sealing body MR is referred to as a transfer mold method.

In the example shown in FIG. 17, the cavities of the molding die are arranged in a region surrounded by the tie bar TB of each device region LFa in planar view. Therefore, the body part of the sealing body MR is formed in a region surrounded by the tie bar TB of each device region LFa as shown in FIG. 17. Further, a part of resin leaked from the cavities is dammed by the tie bar TB. Therefore, the respective outer lead parts OLD of the leads LD are exposed from the sealing body MR.

<Plating Process>

Next, in a plating process shown in FIG. 9, the metal film MC (see FIG. 2) is formed on the exposed surfaces of the leads LD shown in FIG. 17 by a plating method. The metal film MC formed in the process is formed so that the solder material for electrically coupling the leads LD to the terminals on the mounting substrate side easily wets the leads LD when the semiconductor device PKG1 is mounted on a mounting substrate (not shown).

In the process, it is preferable to form the metal film MC (see FIG. 2) made of solder on the exposed surfaces of the leads LD. Further, as a method of forming the metal film MC, an electroplating method in which ionized metal ions are deposited on the exposed surfaces of the leads LD can be applied. The electroplating method is preferable because the film quality of the metal film MC can be easily controlled by controlling the current when the metal film MC is formed. Further, an electrolytic plating method is preferable because the metal film MC can be formed in a short time.

<Lead Cut Process>

Figure 18:
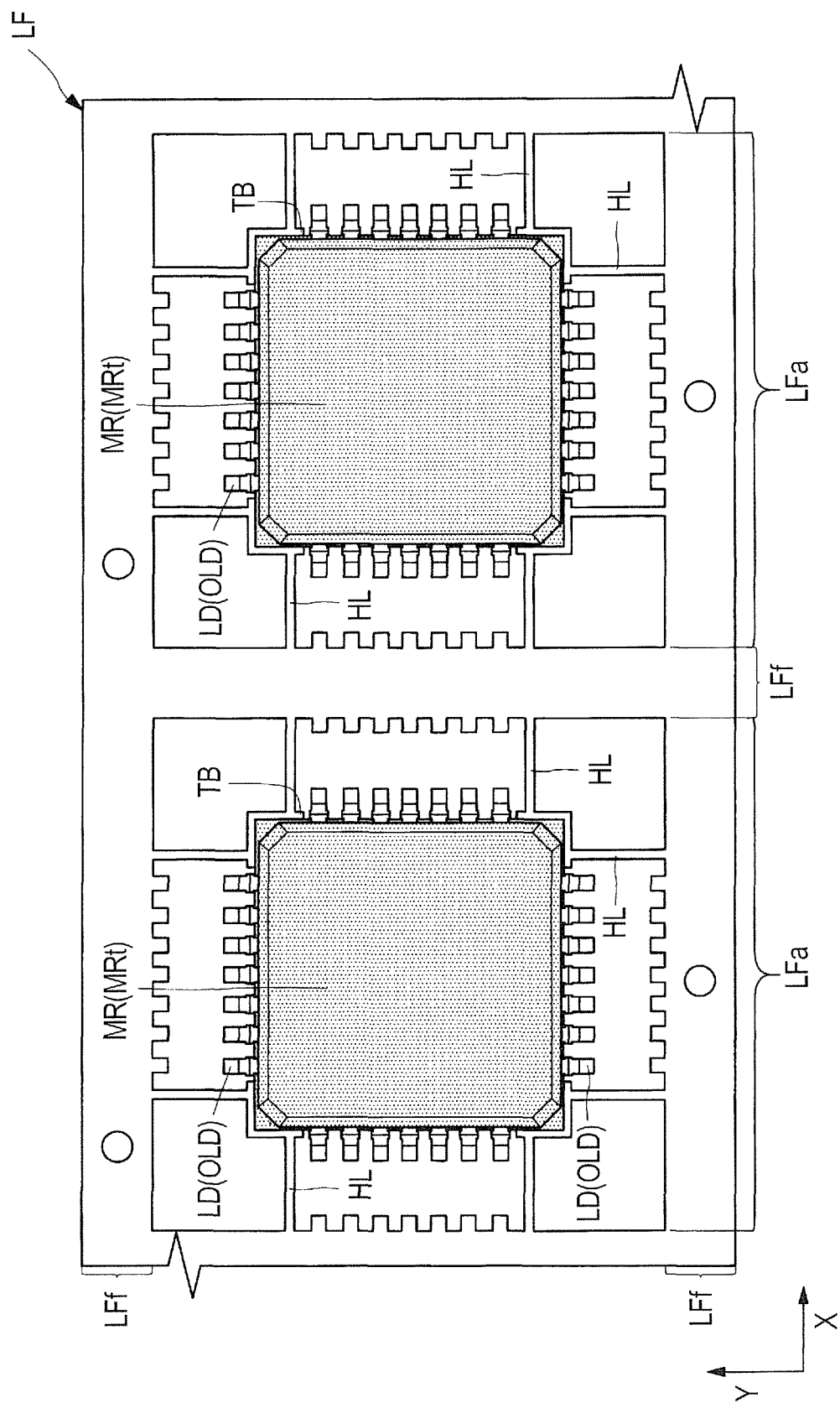
FIG. 18 is an enlarged plan view for showing a state in which a metal film is formed on the exposed surfaces of a plurality of leads shown in FIG. 17 and is cut followed by molding.

Next, in a lead cut process shown in FIG. 9, the respective outer lead parts OLD of the leads LD are cut as shown in FIG. 18, and the leads LD are separated from the lead frame LF. Further, the leads LD are molded after cutting the leads LD, and bending work as shown in FIG. 2 is performed in the embodiment. FIG. 18 is an enlarged plan view for showing a state in which the metal film is formed on the exposed surfaces of the leads shown in FIG. 17 and is cut followed by molding.

In the process, the tie bar TB connecting the leads LD is cut. Further, the respective leads LD are separated from the frame part LFf. As a result, the leads LD become members (independent members) that are separated from each other. Further, after the leads LD are separated, the sealing body MR and the leads LD are supported by the frame part LFf through the hanging leads HL.

It should be noted that the tie bar TB is cut after the plating process in the description of the embodiment. However, the plating process may be performed after only the tie bar TB is cut first, and further the respective leads LD may be separated from the frame part LFf. Accordingly, the metal film MC can be also formed on the cut surface of the tie bar TB, and the cut surface of the tie bar TB can be suppressed from discoloring due to oxidization. Further, since the plating process is performed before the leads LD are separated from the frame part LFf, the deformation of the leads LD due to a plating liquid can be suppressed.

The leads LD and the tie bar TB are cut by press work using a die for cutting to be described later. Further, the cut leads LD can be molded as shown in, for example, FIG. 2 by bending the outer lead parts OLD of the leads LD by press work using a die for molding (not shown).

<Dicing Process>

Next, in a dicing process shown in FIG. 9, the respective hanging leads HL shown in FIG. 18 are cut, and the semiconductor package is separated in each of the device regions LFa. In the process, the hanging leads HL and resin left at the corner parts of the sealing body MR are cut to obtain the semiconductor device PKG1 (specifically, an inspection target before an inspection process) that is the semiconductor package shown in FIG. 1. As a cutting method, for example, the hanging leads HL and the resin can be cut by press work using a cutting die (not shown) as similar to the lead molding process.

After the process, necessary inspections and tests such as an appearance inspection and an electrical test are conducted, and the product that has passed the tests is the semiconductor device PKG1 shown in FIG. 1 to FIG. 4. Then, the semiconductor device PKG1 is shipped, or mounted on a mounting substrate (not shown).

Modified Example

The invention achieved by the inventors has been described above in detail on the basis of the embodiment. However, it is obvious that the present invention is not limited to the above-described embodiment, but can be variously changed without departing from the scope of the invention. It should be noted that some modified examples have been described in the above-described embodiment. However, a representative modified example other than those described in the embodiment will be described below.

For example, in the example shown in FIG. 6, the number of pads PD of the semiconductor chip CP1 is different from that of the semiconductor chip CP2. However, the number of pads PD can be the same.

Further, for example, the embodiment has been described above by exemplifying the embodiment applied to a QFP-type semiconductor device as an example of a semiconductor device. However, the above-described technique can be applied to semiconductor devices of various modified examples in addition to the QFP-type. For example, the technique can be applied to a so-called SOP-type semiconductor device in which the sealing body is formed in a rectangular shape in planar view, the leads protrude from the respective long sides facing each other, and no leads protrude from the short sides facing each other. However, from the viewpoint of reducing the clearance between the pads PD and the leads LD, as the layout of the SOP-type, the circumferences of the semiconductor chip CP1 and the semiconductor chip CP2 are preferably surrounded by the inner lead parts in planar view by bending some inner lead parts of the leads.

Further, for example, various modified examples have been described above. However, a combination of the above-described modified examples can be applied.

What is claimed is:

1. A semiconductor device, comprising:
   a first semiconductor chip including a first top surface in a quadrangular shape, a first back surface opposite to the first top surface, a plurality of first pads arranged over the first top surface, and a first inductor that is provided on a side of the first top surface and is electrically coupled to the first pads;
   a second semiconductor chip including a second top surface in a quadrangular shape, a second back surface opposite to the second top surface, a plurality of second pads arranged over the second top surface, and a second inductor that is provided on a side of the second top surface and is electrically coupled to the second pads, the second inductor being mounted over the first semiconductor chip through an insulating film so as to face the first inductor;
   a chip mounting part over which the first semiconductor chip and the second semiconductor chip are mounted;
   a plurality of leads mounted around the chip mounting part;
   a plurality of first wires through which each of a plurality of first leads of the leads and each of the first pads of the first semiconductor chip are electrically coupled to each other; and
   a plurality of second wires through which each of a plurality of second leads of the leads and each of the second pads of the second semiconductor chip are electrically coupled to each other,
   wherein the first pads are provided along each of a first chip side and a second chip side intersecting with the first chip side among four sides of the first top surface,
   wherein the second semiconductor chip is mounted over the first semiconductor chip in such a manner that each of the first pads of the first semiconductor chip is not overlapped with the second semiconductor chip in a first planar view viewed from the side of the first top surface of the first semiconductor chip and each of the second pads of the second semiconductor chip is not overlapped with the first semiconductor chip in a second planar view viewed from the side of the second top surface of the second semiconductor chip, and
   wherein the insulating film is disposed on the first top surface and on the second top surface such that, in the first planar view, an edge of the insulating film overlaps with an edge of the second top surface and another edge of the insulating film is located inside the second top surface.

2. The semiconductor device according to claim 1, wherein the second semiconductor chip is mounted over the first semiconductor chip in such a manner that each of the second pads is not overlapped with the chip mounting part in the second planar view.

3. The semiconductor device according to claim 1, wherein a plurality of hanging leads coupled to the chip mounting part is further provided, wherein the chip mounting part has a first base material side, a second base material side extending in a direction intersecting with the first base material side, a third base material side facing the first base material side, a fourth base material side that faces the second base material side and extends in a direction intersecting with the third base material side, a first corner part formed by the third base material side and the fourth base material side, and a second corner part formed by the first base material side and the second base material side, wherein the second semiconductor chip is mounted over the first semiconductor chip so as to be overlapped with the first corner part in the first planar view, and wherein the hanging leads are coupled to parts other than the first corner part and the second corner part of the chip mounting part.

4. The semiconductor device according to claim 1, wherein an area of a part where a projected part of the second semiconductor chip not overlapped with the first semiconductor chip is overlapped with the chip mounting part is smaller than that of a part where the projected part is not overlapped with the chip mounting part.

5. The semiconductor device according to claim 1, wherein the first semiconductor chip has the first chip side, the second chip side intersecting with the first chip side, a third chip side facing the first chip side, and a fourth chip side facing the third chip side, wherein the second semiconductor chip has a fifth chip side arranged so as to be aligned along the first chip side of the first semiconductor chip, a sixth chip side intersecting with the fifth chip side, a seventh chip side facing the fifth chip side, and an eighth chip side facing the sixth chip side, wherein the chip mounting part has a first base material side arranged so as to be aligned along the first chip side of the first semiconductor chip, a second base material side intersecting with the first base material side, a third base material side facing the first base material side, and a fourth base material side facing the second base material side, and wherein a first distance from the third chip side of the first semiconductor chip to the third base material side of the chip mounting part is smaller than a second distance from the seventh chip side of the second semiconductor chip to the third base material side of the chip mounting part in the first planar view.

6. The semiconductor device according to claim 5, wherein a third distance from the fourth chip side of the first semiconductor chip to the fourth base material side of the chip mounting part is smaller than a fourth distance from the eighth chip side of the second semiconductor chip to the fourth base material side of the chip mounting part in the first planar view.

7. The semiconductor device according to claim 6, wherein third wires are coupled between the first base material side of the chip mounting part and the first chip side of the first semiconductor chip, and wherein a fifth distance from the first base material side of the chip mounting part to the first chip side of the first semiconductor chip is larger than the first distance.

8. The semiconductor device according to claim 1, wherein an area of a part where the first semiconductor chip is overlapped with the second semiconductor chip is larger than that of a part where the first semiconductor chip is not overlapped with the second semiconductor chip in the first planar view.

9. The semiconductor device according to claim 1, wherein a metal film is formed over the second back surface of the second semiconductor chip, and wherein third leads of the leads are electrically coupled to the metal film of the second back surface through the third wires.

10. The semiconductor device according to claim 9, wherein the first semiconductor chip and the chip mounting part are electrically coupled to each other through fourth wires coupled to a part of the chip mounting part.

11. The semiconductor device according to claim 1, wherein the chip mounting part has a first base material side, a second base material side extending in a direction intersecting with the first base material side, a third base material side facing the first base material side, a fourth base material side that faces the second base material side and extends in a direction intersecting with the third base material side, a first corner part formed by the third base material side and the fourth base material side, and a second corner part formed by the first base material side and the second base material side, and wherein the second semiconductor chip is mounted over the first semiconductor chip so as to be overlapped with the first corner part and so as not to be overlapped with the second corner part in the first planar view.

12. The semiconductor device according to claim 11, wherein the first semiconductor chip and the second semiconductor chip are sealed with a sealing body, and wherein the sealing body includes four sides and the leads protrude from respective four sides in the first planar view.

13. The semiconductor device according to claim 1, wherein the insulating film comprises an organic insulating film.

14. The semiconductor device according to claim 1, wherein, in the first planar view, said another edge of the insulating film is located outside the first top surface.

15. The semiconductor device according to claim 1, wherein the insulating film comprises a single layer that continuously extends from the first top surface to the second top surface.

16. The semiconductor device according to claim 1, wherein the insulating film abuts the first top surface and the second top surface.

17. The semiconductor device according to claim 1, further comprising a sealing body that seals the first semiconductor chip and the second semiconductor chip, wherein the sealing body is disposed on an area of the first top surface that is exposed outside the insulating film.

18. The semiconductor device according to claim 1, wherein the first inductor comprises a plurality of inductors that transmit and receive signals between the first semiconductor chip and the second semiconductor chip.

* * * * *